US012439784B2

(12) United States Patent
Kim

(10) Patent No.: US 12,439,784 B2
(45) Date of Patent: Oct. 7, 2025

(54) DISPLAY PANEL AND DISPLAY DEVICE INCLUDING THE SAME

(71) Applicant: Samsung Display Co., LTD., Yongin-si (KR)

(72) Inventor: Byoungyong Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 494 days.

(21) Appl. No.: 18/073,635

(22) Filed: Dec. 2, 2022

(65) Prior Publication Data

US 2023/0180556 A1 Jun. 8, 2023

(30) Foreign Application Priority Data

Dec. 3, 2021 (KR) ........................ 10-2021-0171853

(51) Int. Cl.
*H10K 59/131* (2023.01)
*H01L 23/00* (2006.01)

(52) U.S. Cl.
CPC ........... *H10K 59/131* (2023.02); *H01L 24/05* (2013.01); *H01L 24/16* (2013.01); *H01L 2224/02141* (2013.01); *H01L 2224/02145* (2013.01); *H01L 2224/05073* (2013.01); *H01L 2224/05558* (2013.01); *H01L 2224/05583* (2013.01); *H01L 2224/05624* (2013.01); *H01L 2224/05666* (2013.01); *H01L 2224/16145* (2013.01); *H01L 2924/12041* (2013.01)

(58) Field of Classification Search
None
See application file for complete search history.

(56) References Cited

U.S. PATENT DOCUMENTS 6,447,162 B2 9/2002 Clyne
9,591,765 B2 3/2017 Kim et al.
10,010,005 B2 6/2018 Hyun et al.
10,254,860 B2 4/2019 Reynolds et al.
2014/0225071 A1* 8/2014 Park ....................... H10K 71/00 438/34

FOREIGN PATENT DOCUMENTS

KR 10-2005-0059646 6/2005
KR 10-2020-0024378 3/2020

* cited by examiner

*Primary Examiner* — Kyoung Lee
(74) *Attorney, Agent, or Firm* — Lerner David LLP

(57) ABSTRACT

A display panel includes a display area, a pad area adjacent to the display area, pixels disposed in the display area on a substrate, and pads disposed in the pad area on the substrate and electrically connected to pixels. Each of the pads includes a first conductive layer, at least one a first protrusion disposed on the first conductive layer, at least one second protrusion disposed on the first conductive layer and having a thickness smaller than a thickness of the at least one first protrusion, and a second conductive layer disposed on the first conductive layer and overlapping an upper surface of each of the at least one first protrusion and an upper surface of the at least one second protrusion in a plan view.

24 Claims, 26 Drawing Sheets

DISPLAY PANEL AND DISPLAY DEVICE INCLUDING THE SAME

CROSS-REFERENCE TO RELATED APPLICATION(S)

This application claims priority to and benefits of Korean Patent Application No. 10-2021-0171853 under 35 U.S.C. § 119, filed on Dec. 3, 2021 in the Korean Intellectual Property Office (KIPO), the entire contents of which are herein incorporated by reference.

BACKGROUND

1. Technical Field

Embodiments relate to a display panel and a display device including the display panel.

2. Discussion of the Related Art

Flat panel displays have replaced cathode ray tube displays due to characteristics such as light weight and thinness. Representative examples of such flat panel display devices include liquid crystal display devices and organic light emitting display device.

A display device may include a display panel and a driving chip bonded to the display panel. The driving chip may be bonded by an ultrasonic bonding process.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display panel with improved reliability.

Embodiments provide a display device with improved reliability.

A display panel according to an embodiment may include a display area, a pad area adjacent to the display area, pixels disposed in the display area on a substrate, and pads disposed in the pad area on the substrate and electrically connected to the pixels. Each of the pads may include a first conductive layer, at least one first protrusion disposed on the first conductive layer, at least one second protrusion disposed on the first conductive layer and having a thickness smaller than a thickness of the at least one first protrusion, and a second conductive layer disposed on the first conductive layer and overlapping an upper surface of the at least one first protrusion and an upper surface of the at least one second protrusion in a plan view.

In an embodiment, the display panel may further include a step formed between an upper surface of a portion of the second conductive layer overlapping the upper surface of the at least one first protrusion in a plan view and an upper surface of another portion of the second conductive layer overlapping the upper surface of the at least one second protrusion in a plan view.

In an embodiment, the second conductive layer may have a uniform thickness.

In an embodiment, the at least one first protrusion may include first protrusions, the at least one second protrusion may include second protrusions, and the first protrusions and the second protrusions may be arranged in a matrix form in a plan view.

In an embodiment, the first protrusions and the second protrusions may be alternately arranged in a row direction and a column direction.

In an embodiment, the at least one first protrusion may include first protrusions, the at least one second protrusion may include second protrusions, and the first protrusions and the second protrusions may be irregularly arranged in a plan view.

In an embodiment, the second conductive layer may entirely cover a side surface of the at least one first protrusion in a plan view, and the second conductive layer may entirely cover a side surface of the at least one second protrusion in a plan view.

In an embodiment, the second conductive layer may expose at least a portion of a side surface of each of the at least one first protrusion and the at least one second protrusion.

In an embodiment, each of the pads may further include a third protrusion having a thickness smaller than the thickness of the at least one first protrusion and greater than the thickness of the at least one second protrusion, and the second conductive layer may further overlap an upper surface of the third protrusion in a plan view.

In an embodiment, the display panel may further include an encapsulation layer overlapping the pixels in a plan view, and a touch sensing layer disposed on the encapsulation layer and including at least one touch insulating layer and at least one touch electrode layer. The second conductive layer and the touch electrode layer may include a same material.

In an embodiment, the at least one first protrusion may include a first protruding portion and a second protruding portion disposed on the first protruding portion.

In an embodiment, each of the first protruding portion and the second protruding portion may include an organic material, and the at least one second protrusion and the first protruding portion may include a same material.

In an embodiment, the first protruding portion and the at least one second protrusion may be separated from each other.

In an embodiment, the first protruding portion and the at least one second protrusion may be integral with each other.

In an embodiment, the second conductive layer may entirely cover an upper surface and a side surface of the second protruding portion.

In an embodiment, the second conductive layer may entirely cover an upper surface of the second protruding portion, and the second conductive layer may expose at least a portion of a side surface of the second protruding portion.

In an embodiment, the first protruding portion may include an inorganic material, the second protruding portion may include an organic material, and the at least one second protrusion and the second protruding portion may include a same material.

A display panel according to an embodiment may include a display area, a pad area adjacent to the display area, pixels disposed in the display area on a substrate, and pads disposed in the pad area on the substrate and electrically connected to the pixels. Each of the pads may include a first conductive layer, a first organic layer disposed on the first conductive layer, a second organic layer partially disposed on the first organic layer, and a second conductive layer disposed on the first conductive layer, overlapping an upper surface of the second organic layer in a plan view, and exposing at least a portion of a side surface of the second organic layer.

In an embodiment, the second organic layer may include stripe patterns, and the second conductive layer may overlap an upper surface of each of the stripe patterns in a plan view and expose at least a portion of a side surface of each of the stripe patterns.

In an embodiment, the second organic layer may include isolated patterns arranged in a matrix form in a plan view, the second conductive layer may include stripe patterns respectively corresponding to the isolated patterns, and each of the stripe patterns may expose a portion of a side surface of one of the isolated patterns corresponding to the stripe patterns.

In an embodiment, each of the pads may further include an inorganic layer disposed between the first organic layer and the second organic layer.

A display device according to an embodiment may include a display panel including a display area, a pad area adjacent to the display area, pixels disposed in the display area on a substrate, and pads disposed in the pad area on the substrate and electrically connected to the pixels and a driving chip bonded to the pad area on the substrate and including bumps connected to the pads. Each of the pads may include a first conductive layer, a first protrusion disposed on the first conductive layer, a second protrusion disposed on the first conductive layer and having a thickness smaller than a thickness of the first protrusion, and a second conductive layer disposed on the first conductive layer and overlapping an upper surface of the first protrusion and an upper surface of the second protrusion.

In an embodiment, each of the bumps may directly contact the second conductive layer of each of the pads corresponding to the bumps.

In an embodiment, the driving chip may be an ultrasonically-bonded driving chip.

Therefore, a display device according to example embodiments may include a display panel including pads and a driving chip bonded to the display panel and including bumps. Each of the pads may include protrusions and a conductive layer covering the protrusions. Accordingly, the frictional force between the bottom surface of each of the bumps and the corresponding upper surface of the pad may be improved. Accordingly, in the ultrasonic bonding process, a connection defect between the pads and the bumps may be prevented or reduced. Accordingly, the reliability of the display device may be improved.

The protrusions may have different thicknesses. Accordingly, even though irregular uneven patterns are formed on the bottom surface of each of the bumps, a contact area between the bottom surface of each of the bumps and the top surface of the pad corresponding to the bumps may be relatively increased. Accordingly, in the ultrasonic bonding process, connection failure between the pads and the bumps may be further prevented or reduced. Accordingly, the reliability of the display device may be further improved.

It is to be understood that both the foregoing general description and the following detailed description are non-limiting examples.

BRIEF DESCRIPTION OF THE DRAWINGS

The accompanying drawings, which are included to provide a further understanding of the disclosure and are incorporated in and constitute a part of this specification, illustrate embodiments together with the description.

DETAILED DESCRIPTION OF THE EMBODIMENTS

Figure 1:
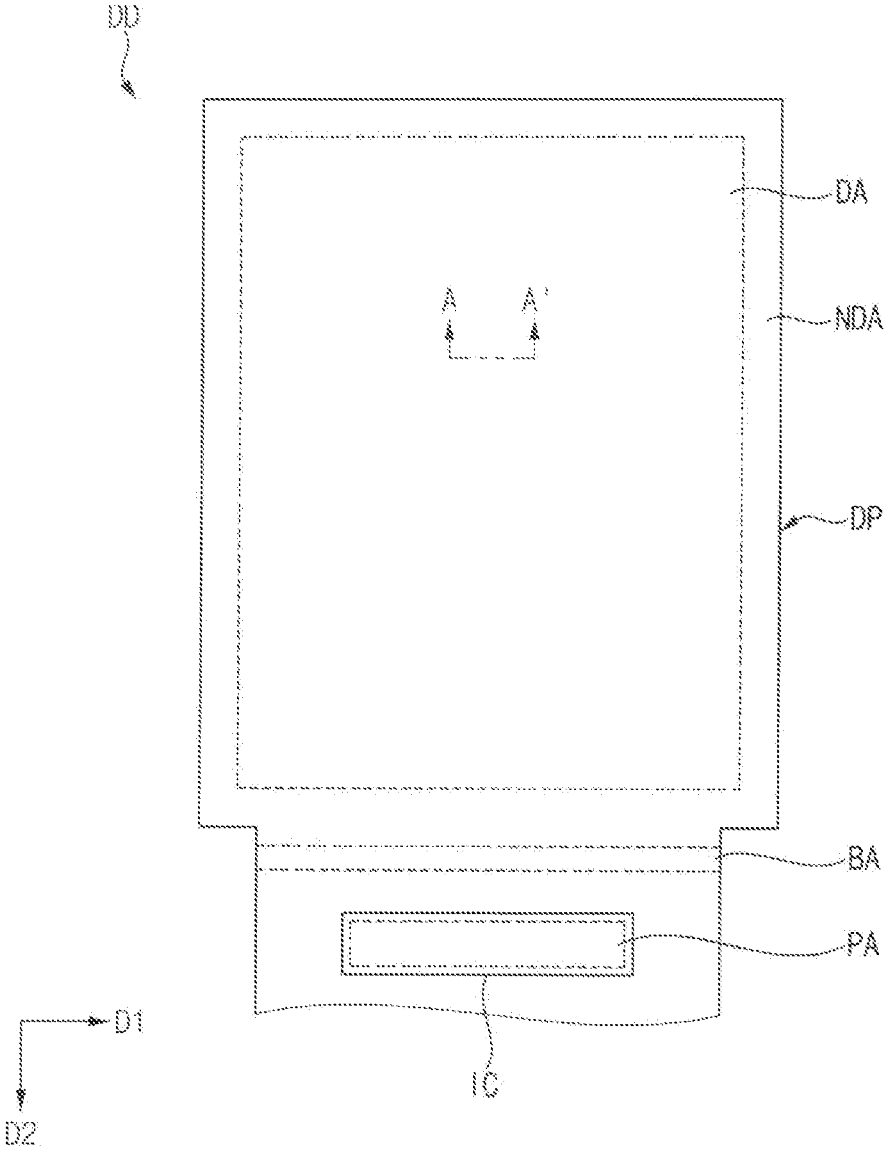
FIG. 1 is a schematic plan view illustrating a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "connected to" or "coupled to" or the like (e.g., contact) may include a physical or electrical connection or coupling. Further, a connection or coupling (or the like (e.g., contact) may be direct or indirect. If a contact is described as a direct contact, then no intervening element may be present.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment of the disclosure.

Referring to FIG. 1, a display device DD according to embodiments may include a display panel DP and a driving chip IC.

The display panel DP (or a substrate included in the display panel DP) may include a display area DA and a non-display area NDA.

Pixels for generating an image may be disposed in the display area DA. The light emitted by each of the pixels may be combined to generate the image. For example, the pixels may be arranged in a matrix form in a first direction D1 and a second direction D2 crossing (intersecting) the first direction D1. The second direction D2 may be perpendicular to the first direction D1.

The non-display area NDA may be positioned adjacent to the display area DA. For example, the non-display area NDA may surround the display area DA in a plan view.

The non-display area NDA may include a pad area PA. In an embodiment, the pad area PA may be located at a side of the display area DA. For example, the pad area PA may be spaced apart from the display area DA in the second direction D2. Pads electrically connected to the pixels may be disposed in the pad area PA.

In an embodiment, the non-display area NDA may include a bending area BA positioned between the display area DA and the pad area PA. The bending area BA may be bent about a bending axis extending in the first direction D1. The bending area BA may be bent such that the pad area PA is positioned below the display area DA.

The driving chip IC may be disposed in the pad area PA on the display panel DP. For example, the driving chip IC may be directly mounted on the substrate of the display panel DP using a chip on plastic (COP) method. The driving chip IC may include bumps respectively electrically connected to the pads.

In an embodiment, although not shown in the drawings, a flexible printed circuit board (FPCB) may be attached to an end of the display panel DP in the second direction D2. A printed circuit board (PCB) may be attached to an end of the flexible printed circuit board.

The driving chip IC, the flexible printed circuit board, and the printed circuit board may provide a driving signal to the display panel DP. The driving signal may refer to various signals for driving the display panel DP, such as a driving voltage, a gate signal, and a data signal. The driving signal may be transmitted to the pixels disposed in the display area DA through the pads.

Figure 2:
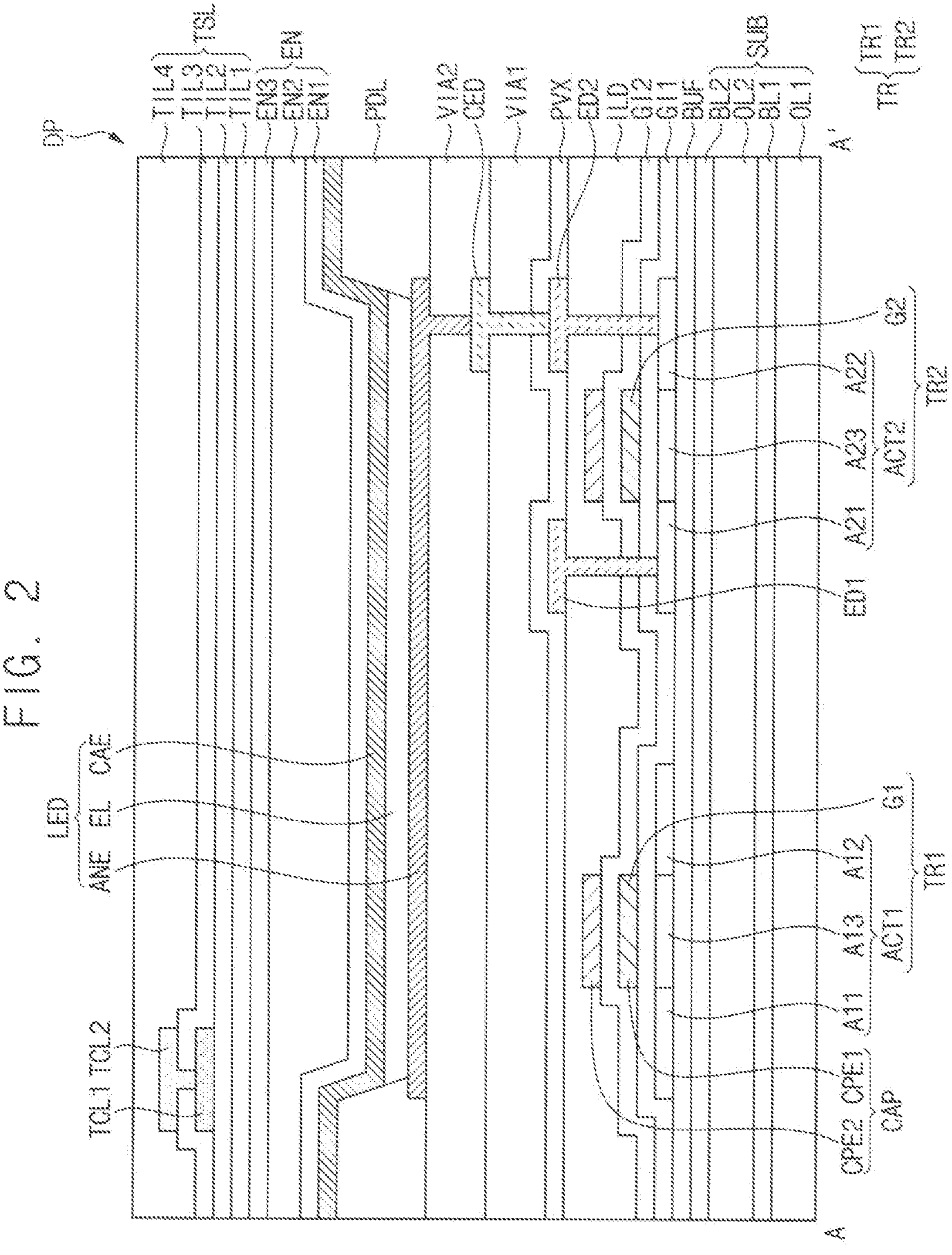
FIG. 2 is a schematic cross-sectional view taken along line A-A' of FIG. 1.

FIG. 2 is a schematic cross-sectional view taken along line A-A' of FIG. 1.

Hereinafter, the display area DA of the display panel DP will be described in detail.

Referring to FIGS. 1 and 2, in an embodiment, the display panel DP may include a substrate SUB, a buffer layer BUF, the pixels, an encapsulation layer EN, and a touch sensing layer TSL. Each of the pixels may include a pixel circuit and a light emitting diode LED connected to the pixel circuit. The pixel circuit may include at least one thin film transistor TR and at least one capacitor CAP.

In an embodiment, the substrate SUB may be a flexible insulating substrate. For example, the substrate SUB may be a transparent resin substrate. In this case, the substrate SUB may have a structure in which one or more organic layers OL1 and OL2 and one or more barrier layers BL1 and BL2 are alternately stacked on each other. The organic layers OL1 and OL2 may include an organic insulating material such as polyimide. The barrier layers BL1 and BL2 may include an inorganic insulating material such as a silicon compound or a metal oxide.

In another embodiment, the substrate SUB may be a rigid insulating substrate. For example, the substrate SUB may include glass, quartz, or the like, or a combination thereof.

The buffer layer BUF may be disposed on the substrate SUB. The buffer layer BUF may prevent impurities such as oxygen and moisture from diffusing onto the substrate SUB through the substrate SUB. The buffer layer BUF may include an inorganic insulating material such as a silicon compound or a metal oxide. Examples of the inorganic insulating material may include silicon oxide ("SiO"), silicon nitride ("SiN"), silicon oxynitride ("SiON"), silicon oxycarbide ("SiOC"), silicon carbonitride ("SiCN"), aluminum oxide ("AlO"), aluminum nitride ("AlN"), tantalum oxide ("TaO"), hafnium oxide ("HfO"), zirconium oxide ("ZrO"), titanium oxide ("TiO"), and the like, but the disclosure is not limited thereto. These may be used alone or in combination with each other. The buffer layer BUF may have a single-layer structure or a multi-layer structure including multiple insulating layers.

In an embodiment, a bottom metal layer may be disposed between the substrate SUB and the buffer layer BUF. The bottom metal layer may include a conductive material such as a metal, an alloy, a conductive metal nitride, or a conductive metal oxide.

In an embodiment, the bottom metal layer may be formed of an opaque material. The bottom metal layer may block light incident to the thin film transistor TR through the substrate SUB, thereby preventing deterioration of electrical characteristics of the thin film transistor TR.

In an embodiment, the bottom metal layer may be electrically connected to the thin film transistor TR. In another embodiment, the bottom metal layer may be used as a power supply voltage line or a signal line.

In an embodiment, the lower metal layer may be electrically connected to the thin film transistor TR. In another embodiment, the lower metal layer may be used as a power supply voltage line or a signal line.

First and second active layers ACT1 and ACT2 may be disposed on the buffer layer BUF. Each of the first and second active layers ACT1 and ACT2 may include an oxide semiconductor, a silicon semiconductor, an organic semiconductor, or the like. For example, the oxide semiconductor may include at least one oxide of indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"), but the disclosure is not limited thereto. The silicon semiconductor may include amorphous silicon, polycrystalline silicon, or the like. The first active layer ACT1 may include a first area A11, a second area A12, and a channel area A13 positioned between the first area A11 and the second area A12. The second active layer ACT2 may include a first area A21, a second area A22, and a channel area A23 positioned between the first area A21 and the second area A22.

A first gate insulating layer GI1 may be disposed on the first and second active layers ACT1 and ACT2. The first gate insulating layer GI1 may cover the first and second active layers ACT1 and ACT2 on the buffer layer BUF. The first gate insulating layer GI1 may include an inorganic insulating material.

First and second gate electrodes G1 and G2 may be disposed on the first gate insulating layer GI1. The first and second gate electrodes G1 and G2 may overlap the channel areas A13 and A23 of the first and second active layers ACT1 and ACT2, respectively. Each of the first and second gate electrodes G1 and G2 may include a conductive material such as a metal, an alloy, a conductive metal nitride, a conductive metal oxide, a transparent conductive material, or a combination thereof. Examples of the conductive material may include gold ("Au"), silver ("Ag"), aluminum ("Al"), platinum ("Pt"), nickel ("Ni"), titanium ("Ti"), palladium ("Pd"), magnesium ("Mg"), calcium ("Ca"), lithium ("Li"), chromium ("Cr"), tantalum ("Ta"), tungsten ("W"), copper ("Cu"), molybdenum ("Mo"), scandium ("Sc"), neodymium ("Nd"), iridium ("Ir"), an alloy containing aluminum, an alloy containing silver, an alloy containing copper, an alloy containing molybdenum, aluminum nitride ("AlN"), tungsten nitride ("WN"), titanium nitride ("TiN"), chromium nitride ("CrN"), tantalum nitride ("TaN"), strontium ruthenium oxide ("SrRuO"), zinc oxide ("ZnO"), indium tin oxide ("ITO"), tin oxide ("SnO"), indium oxide ("InO"), gallium oxide ("GaO"), indium zinc oxide ("IZO") and the like, but the disclosure is not limited thereto. These may be used alone or in combination with each other. Each of the first and second gate electrodes G1 and G2 may have a single-layer structure or a multi-layer structure including conductive layers.

The first active layer ACT1 and the first gate electrode G1 may form a first transistor TR1. The first transistor TR1 may be a driving transistor. The first gate electrode G1 may also function as a lower electrode CPE1 of the capacitor CAP. The second active layer ACT2 and the second gate electrode G2 may form a second transistor TR2. The second transistor TR2 may be a switching transistor.

A second gate insulating layer GI2 may be disposed on the first and second gate electrodes G1 and G2. The second gate insulating layer GI2 may cover the first and second gate electrodes G1 and G2 on the first gate insulating layer GI1. The second gate insulating layer GI2 may include an inorganic insulating material.

An upper electrode CPE2 may be disposed on the second gate insulating layer GI2. The upper electrode CPE2 may overlap the lower electrode CPE1 (e.g., the gate electrode G1). The lower electrode CPE1, the second gate insulating layer GI2, and the upper electrode CPE2 may form a capacitor CAP. In an embodiment, a length of each of the lower electrode CPE1 and the upper electrode CPE2 may be longer than a length illustrated in FIG. 2.

An interlayer insulating layer ILD may be disposed on the upper electrode CPE2. The interlayer insulating layer ILD may cover the upper electrode CPE2 on the second gate insulating layer GI2. The interlayer insulating layer ILD may include an inorganic insulating material.

A first electrode ED1 and a second electrode ED2 may be disposed on the interlayer insulating layer ILD. The first electrode ED1 and the second electrode ED2 may be respectively connected to the first area A21 and the second area A22 of the second active layer ACT2 through contact holes. Each of the first electrode ED1 and the second electrode ED2 may include a conductive material. For example, each of the first electrode ED1 and the second electrode ED2 may have a three-layer structure of Ti/Al/Ti, but the disclosure is not limited thereto.

A passivation layer PVX may be disposed on the first electrode ED1 and the second electrode ED2. The passivation layer PVX may cover the first electrode ED1 and the second electrode ED2 on the interlayer insulating layer ILD. The passivation layer PVX may include an inorganic insulating material. In an embodiment, the passivation layer PVX may be omitted.

A first via insulating layer VIA1 may be disposed on the passivation layer PVX. The first via insulating layer VIA1 may include an organic insulating material. Examples of the organic insulating material may include photoresist, polyacryl-based resin, polyimide-based resin, polyamide-based resin, siloxane-based resin siloxane-based resin, acryl-based resin, epoxy-based resin, etc., but the disclosure is not limited thereto. These may be used alone or in combination with each other.

A connection electrode CED may be disposed on the first via insulating layer VIA1. The connection electrode CED may be connected to the second electrode ED2 through a contact hole formed in the first via insulating layer VIA1. The connection electrode CED may include a conductive material. For example, the connection electrode CED may have a three-layer structure of Ti/Al/Ti, but the disclosure is not limited thereto.

A second via insulating layer VIA2 may be disposed on the connection electrode CED. The second via insulating layer VIA2 may cover the connection electrode CED on the first via insulating layer VIA1. The second via insulating layer VIA2 may include an organic insulating material. An anode electrode ANE may be disposed on the second via insulating layer VIA2. The anode electrode ANE may include a conductive material. The anode electrode ANE may be connected to the connection electrode CED through a contact hole formed in the second via insulating layer VIA2. Accordingly, the anode electrode ANE may be electrically connected to the second transistor TR2 through the connection electrode CED.

In an embodiment, the second via insulating layer VIA2 and the connection electrode CED may be omitted. In this case, the anode electrode ANE may be directly disposed on the first via insulating layer VIA1 and may be connected to the second electrode ED2 through a contact hole formed in the first via insulating layer VIA1.

A pixel defining layer PDL may be disposed on the second via insulating layer VIA2 and the anode electrode ANE. The pixel defining layer PDL may cover a peripheral portion of the anode electrode ANE and define a pixel opening exposing a central portion of the anode electrode ANE. The pixel defining layer PDL may include an organic insulating material.

An emission layer EL may be disposed on the anode electrode ANE. The emission layer EL may be disposed in the pixel opening of the pixel defining layer PDL. The light emitting layer EL may include at least one of an organic light emitting material and quantum dots.

In an embodiment, the organic light emitting material may include a low molecular weight organic compound or a high molecular weight organic compound. Examples of the low molecular weight organic compound may include copper phthalocyanine, diphenylbenzidine (N,N'-diphenylbenzidine), tris-(8-hydroxyquinoline)aluminum, and the like. Examples of the high molecular weight organic compound may include polyethylenedioxythiophene(poly(3,4-ethylenedioxythiophene), polyaniline, polyphenylenevinylene, polyfluorene, etc., but the disclosure is not limited thereto, and these may be used alone or in combination with each other.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor properties by preventing chemical modification of the core and as a charging layer for imparting electrophoretic properties to the quantum dots.

A cathode electrode CAE may be disposed on the emission layer EL. The cathode electrode CAE may also be disposed on the pixel defining layer PDL. The cathode electrode CAE may include a conductive material. The anode electrode ANE, the emission layer EL, and the cathode electrode CAE may form a light emitting diode LED.

The encapsulation layer EN may be disposed on the cathode electrode CAE. The encapsulation layer EN may include at least one inorganic encapsulation layer and at least one organic encapsulation layer. In an embodiment, the encapsulation layer EN may include a first inorganic encapsulation layer EN1 disposed on the cathode electrode CAE, an organic encapsulation layer EN2 disposed on the first inorganic encapsulation layer EN1, and a second inorganic layer encapsulation layer EN3 disposed on the organic encapsulation layer EN2, but the disclosure is not limited thereto.

The touch sensing layer TSL may be disposed on the encapsulation layer EN. In an embodiment, the touch sensing layer TSL may include a first touch insulating layer TIL1, a second touch insulating layer TIL2, a first touch conductive layer TCL1, a third touch insulating layer TIL3, a second touch conductive layer TCL2, and a fourth touch insulating layer TIL4.

The first touch insulating layer TIL1 may be disposed on the encapsulation layer EN. The first touch insulating layer TIL1 may include an inorganic insulating material.

In an embodiment, the display panel DP may further include a planarization insulating layer (not shown) disposed on the first touch insulating layer TIL1. For example, the planarization insulating layer may be disposed in a hole area on the substrate SUB. The hole area may be located inside the display area DA, may overlap an electronic component such as a camera and a face recognition sensor, and may transmit light.

The second touch insulating layer TIL2 may be disposed on the first touch insulating layer TIL1 and the planarization insulating layer. The second touch insulating layer TIL2 may include an inorganic insulating material.

The first touch conductive layer TCL1 may be disposed on the second touch insulating layer TIL2. In an embodiment, the first touch conductive layer TCL1 may be disposed not to overlap the pixel opening of the pixel defining layer PDL.

The third touch insulating layer TIL3 may be disposed on the first touch conductive layer TCL1. The third touch insulating layer TIL3 may entirely cover the first touch conductive layer TCL1. The third touch insulating layer TIL3 may include an inorganic insulating material.

The second touch conductive layer TCL2 may be disposed on the third touch insulating layer TIL3. In an embodiment, the second touch conductive layer TCL2 may be disposed not to overlap the pixel opening of the pixel defining layer PDL. The second touch conductive layer TCL2 may be connected to the first touch conductive layer TCL1 through a contact hole formed in the third touch insulating layer TIL3.

Each of the first touch conductive layer TCL1 and the second touch conductive layer TCL2 may be made of a conductive material having good conductivity, and may have a single-layer structure or a multi-layer structure including conductive layers. For example, the first touch conductive layer TCL1 and the second touch conductive layer TCL2 may include a transparent conductive material such as ITO or IZO, or a metal such as Al, Cu, Mo, or Ti. For example, the first touch conductive layer TCL1 and the second touch conductive layer TCL2 may have a three-layer structure of Ti/Al/Ti, but the disclosure is not limited thereto.

The fourth touch insulating layer TIL4 may be disposed on the second touch conductive layer TCL2. The fourth touch insulating layer TIL4 may entirely cover the second touch conductive layer TCL2. For example, the fourth touch insulating layer TIL4 may include an organic insulating material.

Hereinafter, embodiments of the pad area PA of the display panel DP will be described in detail. The same or similar reference numerals are used for the same or similar components, and repeated descriptions will be omitted or simplified.

Figure 3:
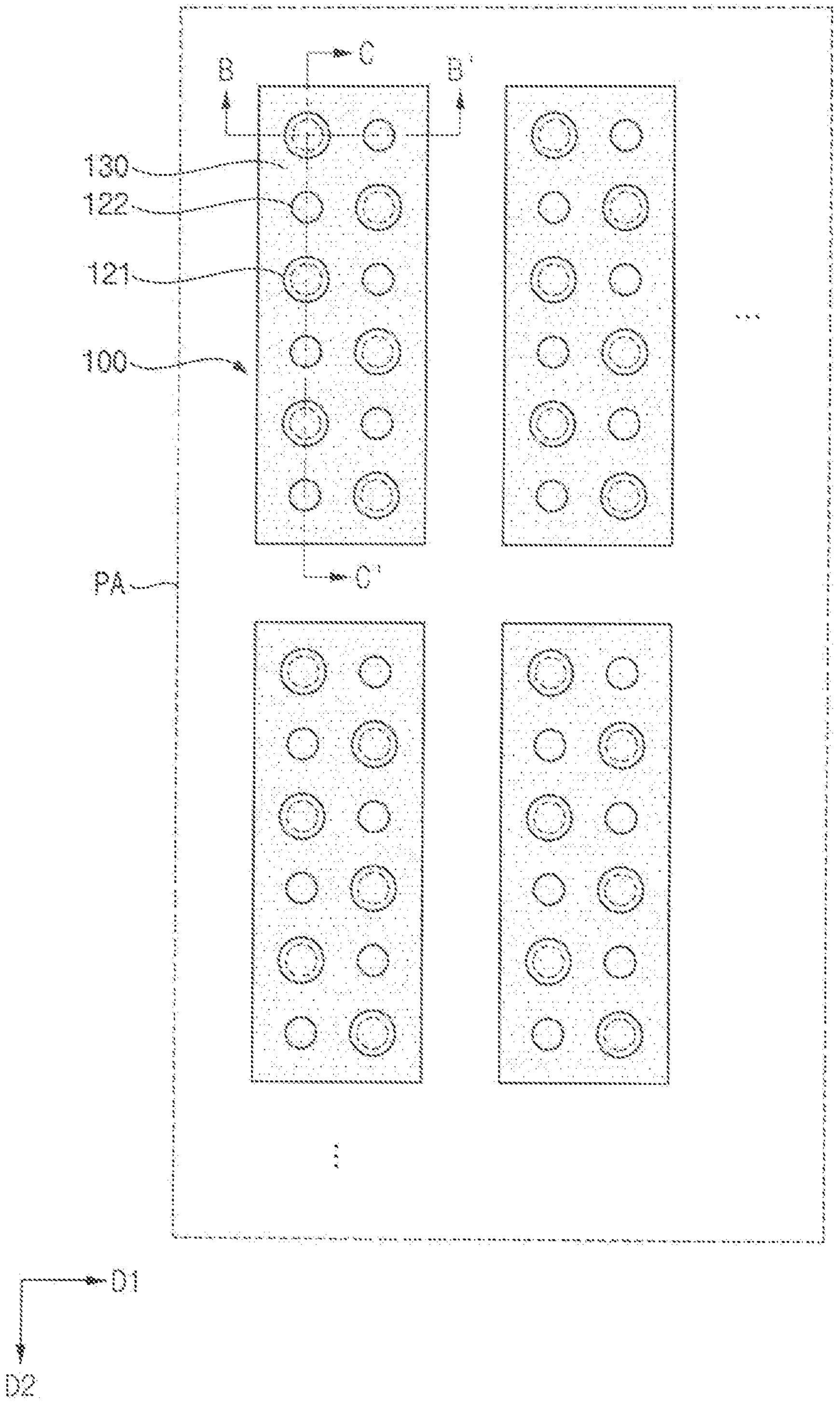
FIG. 3 is an enlarged schematic plan view of an example of a pad area included in the display device of FIG. 1.
Figure 4:
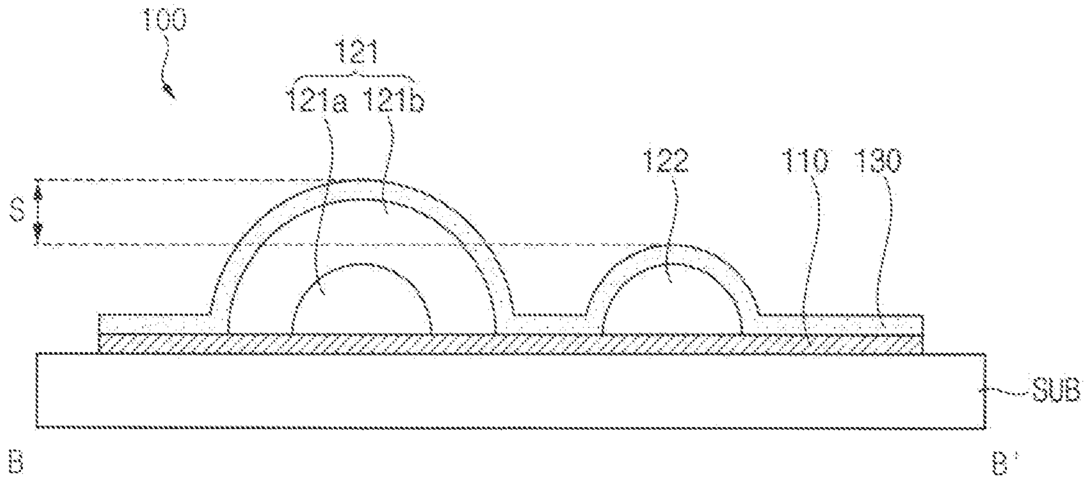
FIG. 4 is a schematic cross-sectional view illustrating an example taken along line B-B' of FIG. 3.
Figure 5:
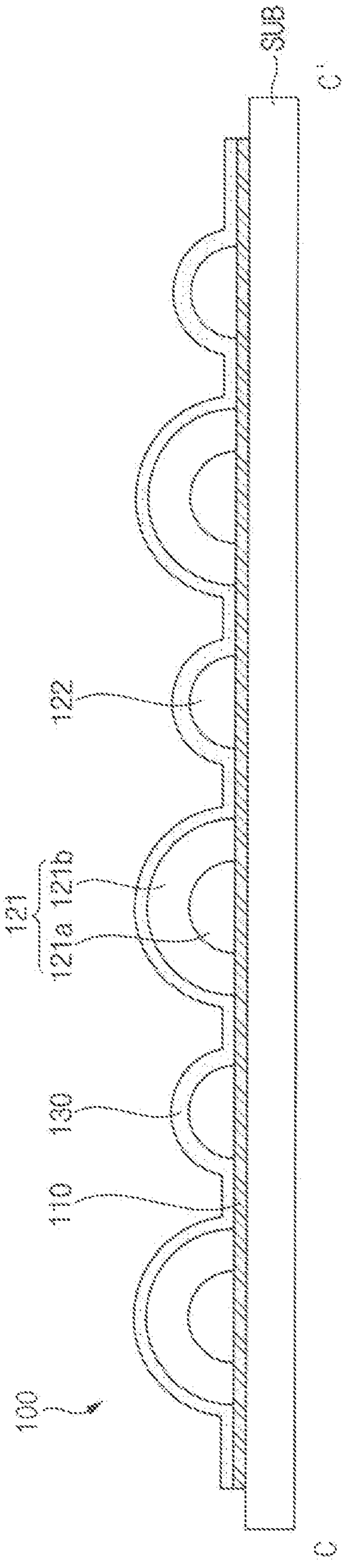
FIG. 5 is a schematic cross-sectional view illustrating an example taken along line C-C' of FIG. 3.

FIG. 3 is an enlarged schematic plan view of an example of a pad area included in the display device of FIG. 1. FIG. 4 is a schematic cross-sectional view illustrating an example taken along line B-B' of FIG. 3. FIG. 5 is a schematic cross-sectional view illustrating an example taken along line C-C' of FIG. 3.

Referring to FIGS. 1, 3, 4, and 5, the display panel DP may include pads 100 disposed in the pad area PA. In an embodiment, each of the pads 100 may extend in the second direction D2.

In an embodiment, as shown in FIG. 3, the pads 100 may be arranged in a matrix form in the first direction D1 and the second direction D2 in a plan view. For example, the pads 100 may be arranged in rows and columns. In another embodiment, the pads 100 may be arranged in a line.

In an embodiment, each of the pads 100 may include a first conductive layer 110, a first protrusion 121, a second protrusion 122, and a second conductive layer 130.

The first conductive layer 110 may be disposed in the pad area PA on the substrate SUB. For example, the first conductive layer 110 may extend in the second direction D2.

The first conductive layer 110 may include a conductive material. The first conductive layer 110 may have a single-layer structure or a multi-layer structure including conductive layers. For example, the first conductive layer 110 may include the same material as the first and second gate electrodes G1 and G2 and may be formed substantially simultaneously with the first and second gate electrodes G1 and G2. However, the disclosure is not limited thereto, and the first conductive layer 110 may be formed substantially simultaneously with at least one of the various conductive layers formed in the display area DA such as the lower metal layer, the upper electrode CPE2, the first electrode ED1, the second electrode ED2, or the connection electrode CED.

The first conductive layer 110 may be connected to the display area DA (e.g., lines and diodes disposed in the display area DA) through a fan-out line (not shown). In an embodiment, the fan-out line may be integral with (e.g., integrally formed with) the first conductive layer 110.

The first protrusion 121 and the second protrusion 122 may be disposed on the first conductive layer 110. The first protrusion 121 and the second protrusion 122 may have different thicknesses. For example, a thickness of the first protrusion 121 may be greater than a thickness of the second protrusion 122.

In FIG. 3, the first protrusion 121 and the second protrusion 122 are shown as having a circular planar shape as a whole, but the disclosure is not limited thereto. The first protrusion 121 and the second protrusion 122 may have a planar shape of a polygonal shape such as a triangle or a square, or an oval shape.

The first protrusion 121 may include a first protruding portion 121*a* and a second protruding portion 121*b* disposed on the first protruding portion 121*a*. In FIGS. 4 and 5, the first protruding portion 121*a* and the second protruding portion 121*b* are shown as having a semicircular cross-sectional shape as a whole, but the disclosure is not limited thereto. The protruding portion 121*b* may have a cross-sectional shape such as a rectangle, a trapezoid, or a triangle (see FIG. 13).

The second protruding portion 121*b* may be formed after the first protruding portion 121*a* is formed. In an embodiment, each of the first protruding portion 121*a* and the second protruding portion 121*b* may include an organic material. For example, the first protruding portion 121*a* may include the same material as the first via insulating layer VIA1 and may be formed substantially simultaneously with the first via insulating layer VIA1. The second protruding portion 121*b* may include the same material as the second via insulating layer VIA2 and may be formed substantially simultaneously with the second via insulating layer VIA2. However, the disclosure is not limited thereto, and the first protruding portion 121*a* may be formed substantially simultaneously with at least one of various organic insulating layers formed in the display area DA after the first conductive layer 110 is formed. The second protruding portion 121*b* may be formed substantially simultaneously with at least one of various organic insulating layers formed in the display area DA after the first protruding portion 121*a* is formed.

The second protrusion 122 may include an organic material. In an embodiment, the second protrusion 122 may include the same material as the first protruding portion 121*a* and may be formed substantially simultaneously with the first protruding portion 121*a*. For example, a thickness of the first protrusion portion 121*a* and a thickness of the second protrusion 122 may be substantially the same.

In another embodiment, the second protrusion 122 may include the same material as the second protruding portion 121*b* and may be formed substantially simultaneously with the second protruding portion 121*b*. For example, a thickness of the second protruding portion 121*b* and a thickness of the second protrusion 122 may be substantially the same.

In an embodiment, the first protruding portion 121*a* and the second protrusion 122 may be separated from each other. The first protrusion 121 and the second protrusion 122 may be spaced apart from each other.

In another embodiment, the first protruding portion 121*a* and the second protrusion 122 may be integral with each other (e.g., integrally formed). The first protrusion 121 and the second protrusion 122 may be connected to each other.

In an embodiment, each of the first protrusion 121 and the second protrusion 122 may be provided in plurality. For example, as shown in FIG. 3, the first protrusions 121 and the second protrusions 122 may be arranged in a matrix form in a plan view. In FIG. 3, although the first protrusions 121 and the second protrusions 122 are shown to be arranged in 6 rows and 2 columns, the disclosure is not limited thereto. The first protrusions 121 and the second protrusions 122 may be arranged in one to five rows or seven or more rows, and one or three columns or more.

In an embodiment, as shown in FIG. 3, the first protrusions 121 and the second protrusions 122 may be alternately arranged in the row direction (e.g. the first direction D1) and the column direction (e.g. the second direction D2).

The second conductive layer 130 may be disposed on the first conductive layer 110. The second conductive layer 130 may cover an upper surface of each of the first protrusion 121 and the second protrusion 122.

In an embodiment, as shown in FIGS. 4 and 5, the second conductive layer 130 may be entirely disposed on the first conductive layer 110. The second conductive layer 130 may entirely cover the first conductive layer 110, the first protrusion 121, and the second protrusion 122. For example, the second conductive layer 130 may entirely cover a side surface of each of the first protrusion 121 and the second protrusion 122. For example, the second conductive layer 130 may entirely cover the upper surface and the side surface of the second protruding portion 121*b*.

The second conductive layer 130 may include a conductive material. The second conductive layer 130 may be formed after the second protruding portion 121*b* is formed. For example, the second conductive layer 130 may include the same material as the first touch electrode layer TCL1 or the second touch electrode layer TCL2 and may be formed substantially simultaneously with the first touch electrode layer TCL1 or the second touch electrode layer TCL2. For example, the second conductive layer 130 may have a three-layer structure of Ti/Al/Ti. However, the disclosure is not limited thereto, and the second conductive layer 130 may be formed substantially simultaneously with at least one of various conductive layers formed in the display area DA after the second protruding portion 121*b* is formed.

In an embodiment, the second conductive layer 130 may have a substantially uniform thickness. As described above, the thickness of the first protrusion 121 may be greater than the thickness of the second protrusion 122. Accordingly, a step S may be formed between an upper surface of a portion of the second conductive layer 130 covering the upper surface of the first protrusion 121 and an upper surface of a portion of the second conductive layer 130 covering the upper surface of the second protrusion 122.

In an embodiment, in case that the second protrusion 122 is formed substantially simultaneously with the first protruding portion 121*a*, the step S may correspond to a thickness (e.g., a distance from an upper surface of the first protruding portion 121*a* to an upper surface of the second protruding portion 121*b*) of the second protruding portion 121*b*. In another embodiment, in case that the second protrusion 122 is formed substantially simultaneously with the second protruding portion 121*b*, the step S may correspond to a thickness of the first protruding portion 121*a*.

The second conductive layer 130 may directly contact a portion of the first conductive layer 110. Accordingly, the second conductive layer 130 may be electrically connected to the first conductive layer 110.

In an embodiment, the driving chip IC including the bumps may be bonded to the pad area PA on the substrate SUB by an ultrasonic bonding process. For example, the pads 100 of the display panel DP and the bumps of the driving chip IC may be connected without any structure or layer interposed therebetween. For example, each of the bumps may directly contact each of the pads 100. For example, a bottom surface of each of the bumps may directly contact a top surface of the second conductive layer 130 of the corresponding pad 100. Meanwhile, the bottom surface of each of the bumps may be a surface on which an irregular concavo-convex pattern may be formed without being substantially flat.

According to embodiments of the disclosure, by the first protrusions 121 and the second protrusions 122 of each of the pads 100, a friction force between the bottom surface of each of the bumps and the top surface of the second conductive layer 130 may be improved. Accordingly, in the ultrasonic bonding process, a connection failure between the pads 100 and the bumps may be prevented or reduced. Therefore, the reliability of the display device DD may be improved.

As the first protrusions 121 and the second protrusions 122 have different thicknesses, the step S may be formed on the upper surface of the second conductive layer 130. Accordingly, a contact area between the bottom surface of each of the bumps on which the irregular concavo-convex pattern is formed and the top surface of the second conductive layer 130 may be relatively increased. Compared to a case in which the protrusions all have the same thickness, the first protrusions 121 may be more readily compressed as the pressure applied in the ultrasonic bonding process is concentrated on the first protrusions 121. Accordingly, a contact area between the bottom surface of each of the bumps and the top surface of the second conductive layer 130 may be increased. Accordingly, in the ultrasonic bonding process, a connection failure between the pads 100 and the bumps may be further prevented or reduced. Accordingly, the reliability of the display device DD may be further improved.

Figure 6:
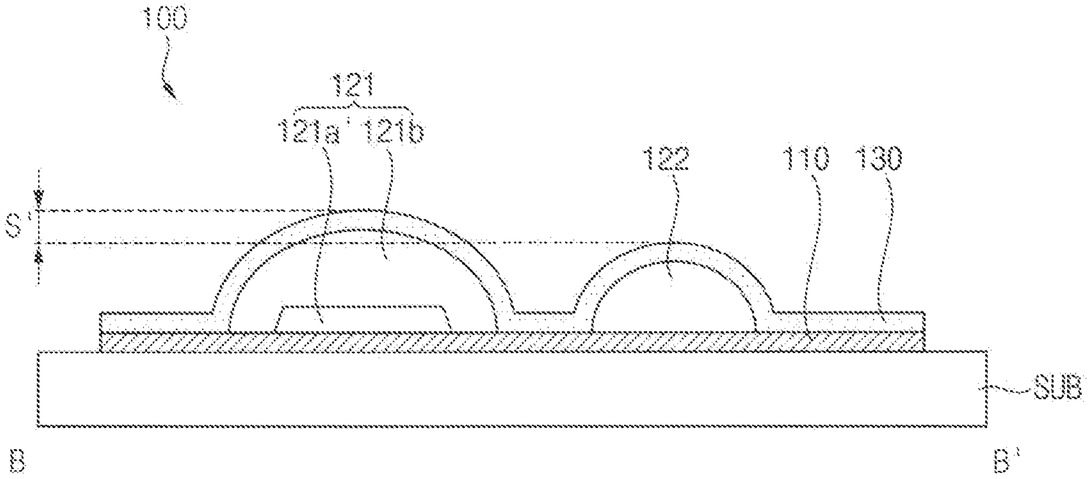
FIG. 6 is a schematic cross-sectional view illustrating another example taken along line B-B' of FIG. 3.

FIG. 6 is a schematic cross-sectional view illustrating another example taken along line B-B' of FIG. 3.

Referring to FIGS. 3 and 6, in an embodiment, the first protruding portion 121*a*' of the first protrusion 121 may include an inorganic material. For example, the first protruding portion 121*a*' may include the same material as the interlayer insulating layer ILD and may be formed substantially simultaneously with the interlayer insulating layer ILD. However, the disclosure is not limited thereto, and the first protruding portion 121*a*' may be formed substantially simultaneously with at least one of various inorganic insulating layers formed in the display area DA after the first conductive layer 110 may be formed.

The second protruding portion 121*b* of the first protrusion 121 may include an organic material. For example, the second protruding portion 121*b* may include the same material as the first via insulating layer VIA1 and may be formed substantially simultaneously with the first via insulating layer VIA1. However, the disclosure is not limited thereto, and the second protruding portion 121*b* may be formed substantially simultaneously with at least one of various organic insulating layers formed in the display area DA after the first protruding portion 121*a*' may be formed.

The second protrusion 122 may include the same material as the second protruding portion 121*b* and may be formed substantially simultaneously with the second protruding portion 121*b*. For example, the thickness of the second protrusion portion 121*b* and the thickness of the second protrusion 122 may be substantially the same.

In an embodiment, the second conductive layer 130 may have a substantially uniform thickness. A thickness of the first protrusion 121 may be greater than a thickness of the second protrusion 122. Accordingly, a step S' may be formed between an upper surface of a portion of the second conductive layer 130 covering the upper surface of the first protrusion 121 and an upper surface of a portion of the second conductive layer 130 covering the upper surface of the second protrusion 122. The step S' may correspond to the thickness of the first protruding portion 121*a*'.

Figure 7:
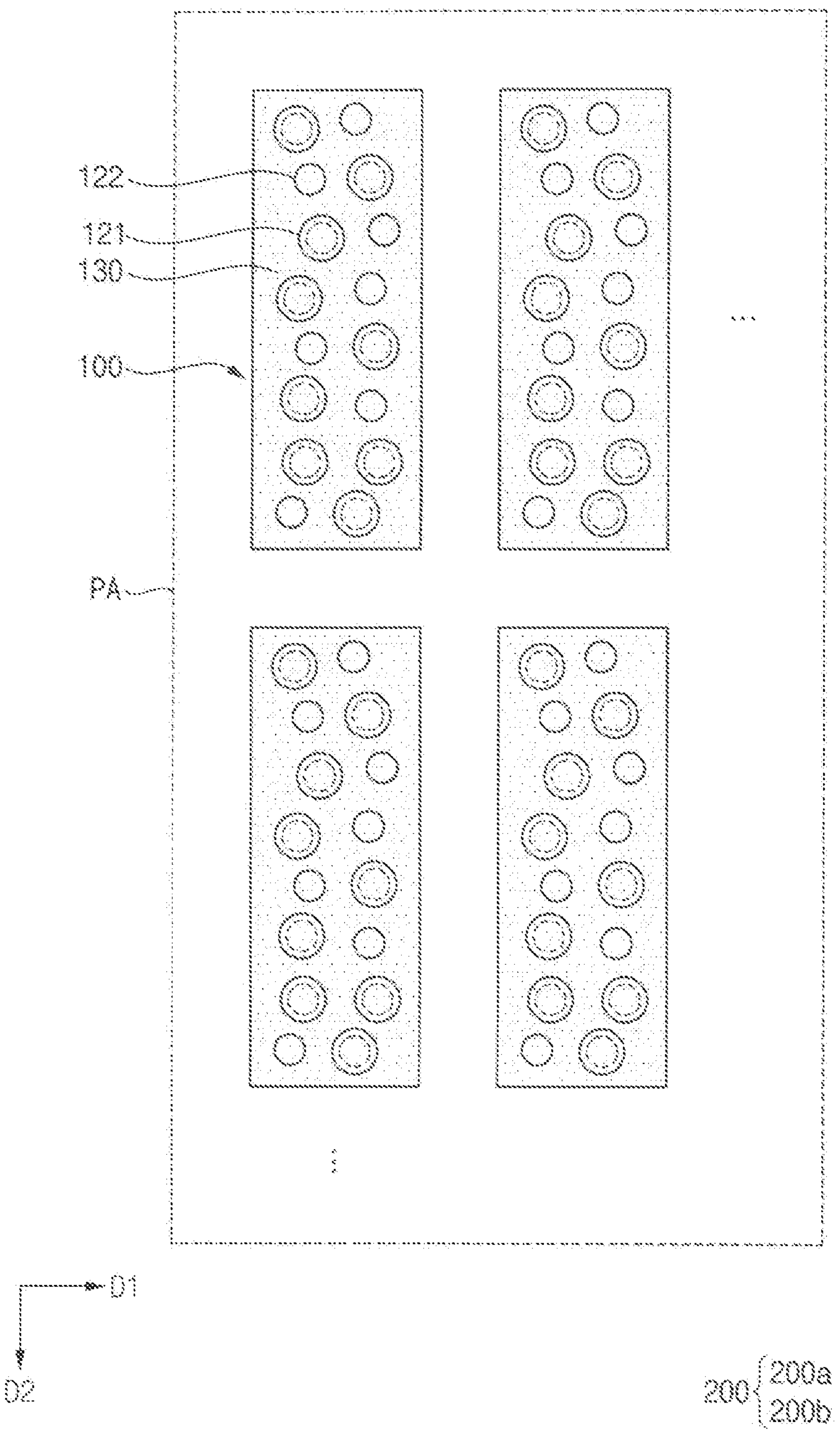
FIG. 7 is an enlarged schematic plan view of another example of a pad area included in the display device of FIG. 1.

FIG. 7 is an enlarged schematic plan view of another example of a pad area included in the display device of FIG. 1.

Referring to FIG. 7, in an embodiment, in each of the pads 100, the first protrusions 121 and the second protrusions 122 may be irregularly disposed in a plan view.

Figure 8:
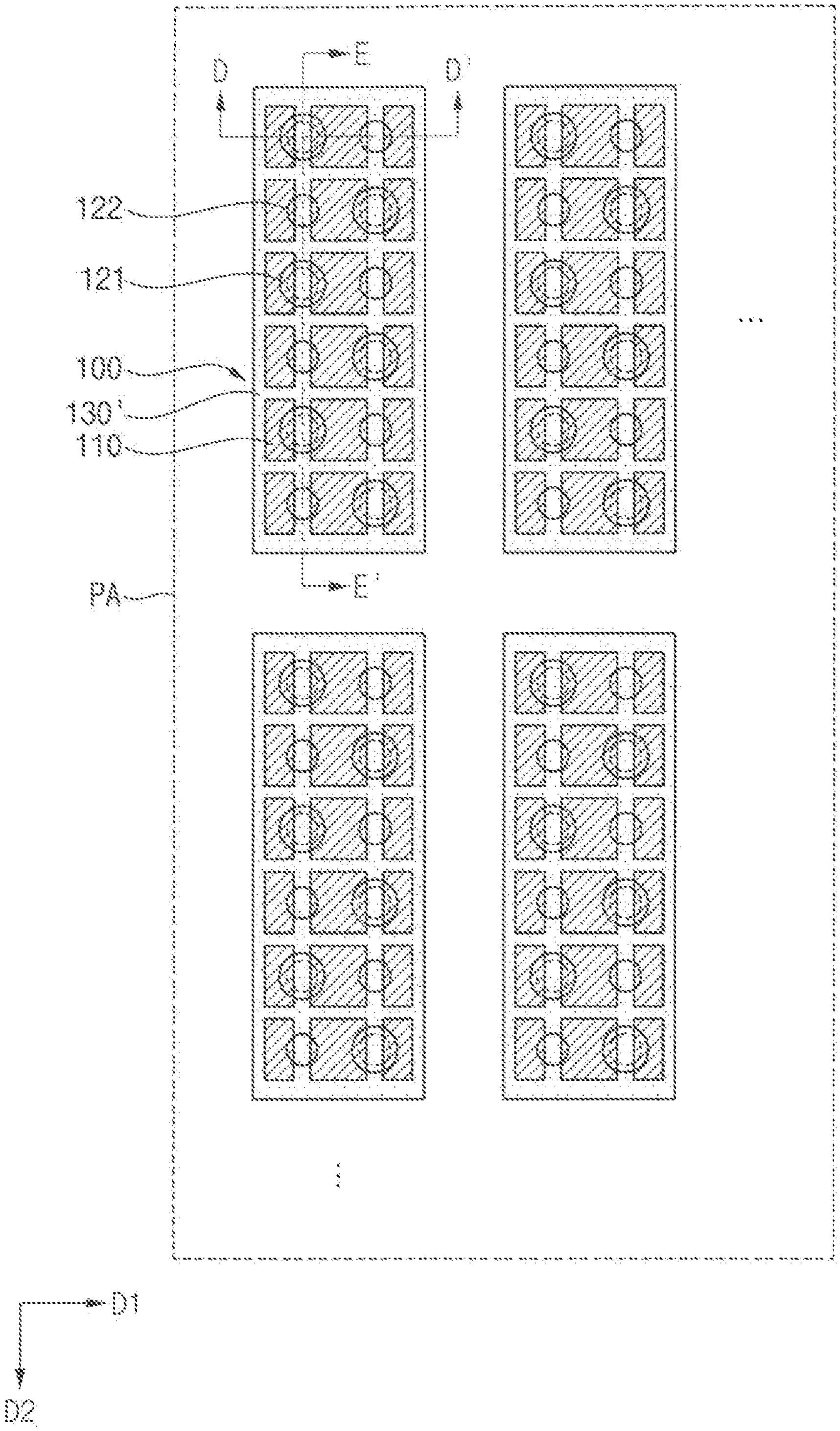
FIG. 8 is an enlarged schematic plan view of still another example of a pad area included in the display device of FIG. 1.
Figure 9:
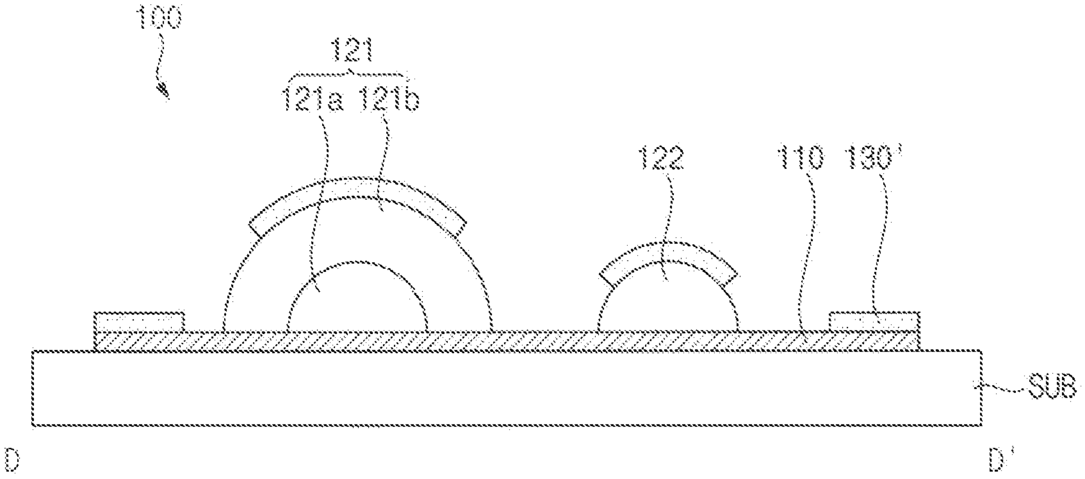
FIG. 9 is a schematic cross-sectional view illustrating an example taken along line D-D' of FIG. 8.
Figure 10:
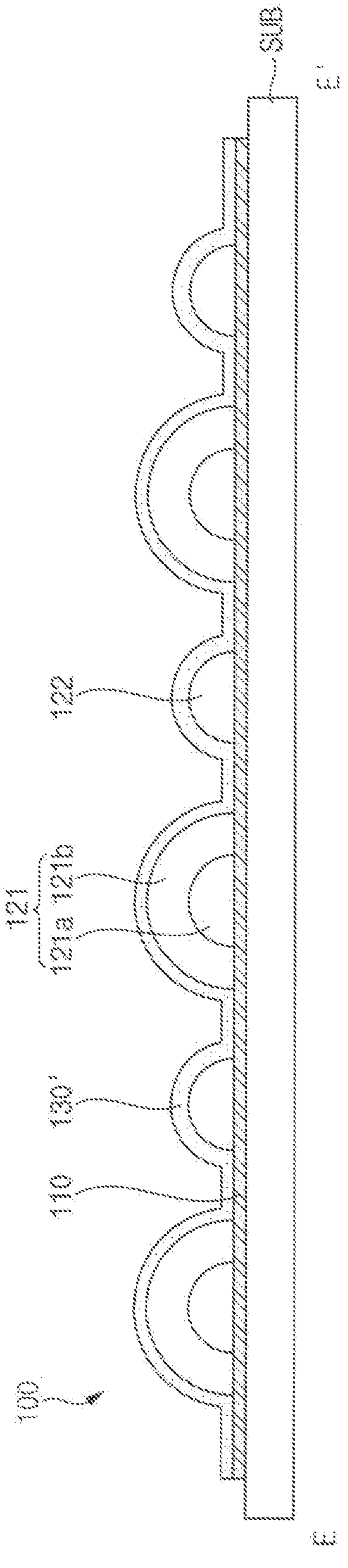
FIG. 10 is a schematic cross-sectional view illustrating an example taken along line E-E' of FIG. 8.

FIG. 8 is an enlarged schematic plan view of still another example of a pad area included in the display device of FIG. 1. FIG. 9 is a schematic cross-sectional view illustrating an example taken along line D-D' of FIG. 8. FIG. 10 is a schematic cross-sectional view illustrating an example taken along line E-E' of FIG. 8.

Referring to FIGS. 8 to 10, in an embodiment, the second conductive layer 130' may cover an upper surface of each of the first protrusion 121 and the second protrusion 122, and may expose at least a portion of a side surface of the first protrusion 121 and the second protrusions 122. For example, the second conductive layer 130' may cover the upper surface of the second protruding portion 121*b* and may expose at least a portion of the side surface of the second protruding portion 121*b*. For example, the second conductive layer 130' may have a grid shape in a plan view.

According to an embodiment, it may be possible to prevent or reduce cracks in the second conductive layer 130' that occur as the first protruding portion 121*a*, the second protruding portion 121*b*, and the second protrusion 122 including the organic material are compressed by the pressure applied in the ultrasonic bonding process.

Figure 11:
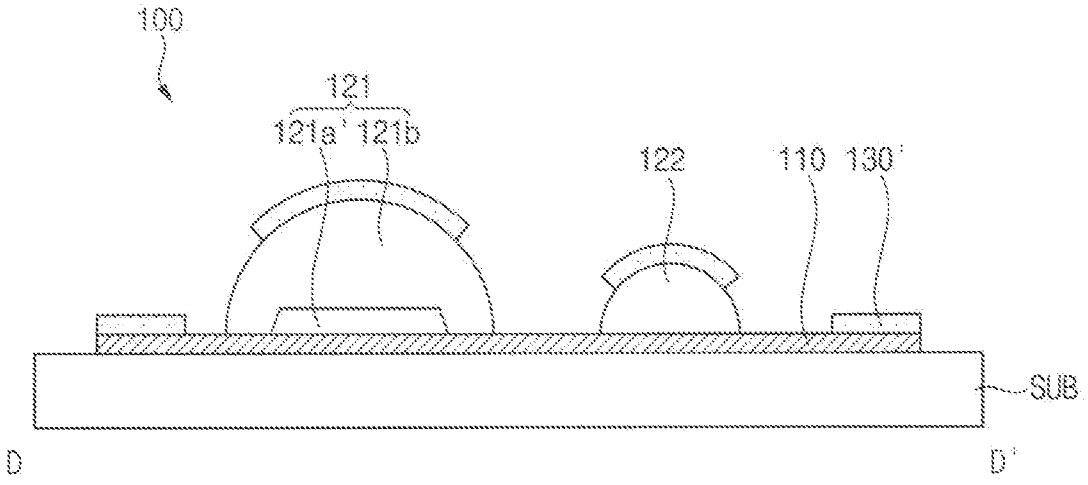
FIG. 11 is a schematic cross-sectional view illustrating another example taken along line D-D' of FIG. 8.

FIG. 11 is a schematic cross-sectional view illustrating another example taken along line D-D' of FIG. 8.

Referring to FIG. 11, in an embodiment, the first protruding portion 121*a*' of the first protrusion 121 may include an inorganic material. The second protruding portion 121*b* of the first protrusion 121 may include an organic material. The second protrusion 122 may include the same material as the second protruding portion 121*b* and may be formed substantially simultaneously with the second protruding portion 121*b*.

The second conductive layer 130' may cover an upper surface of each of the first protrusion 121 and the second protrusion 122, and may expose at least a portion of a side surface of each of the first protrusion 121 and the second protrusion 122. For example, the second conductive layer 130' may cover the upper surface of the second protruding portion 121*b* and may expose at least a portion of the side surface of the second protruding portion 121*b*.

According to an embodiment, it may be possible to prevent or reduce cracks in the second conductive layer 130' that occur as the second protruding portion 121*b* and the second protrusion 122 including the organic material are compressed by the pressure applied in the ultrasonic bonding process.

Figure 12:
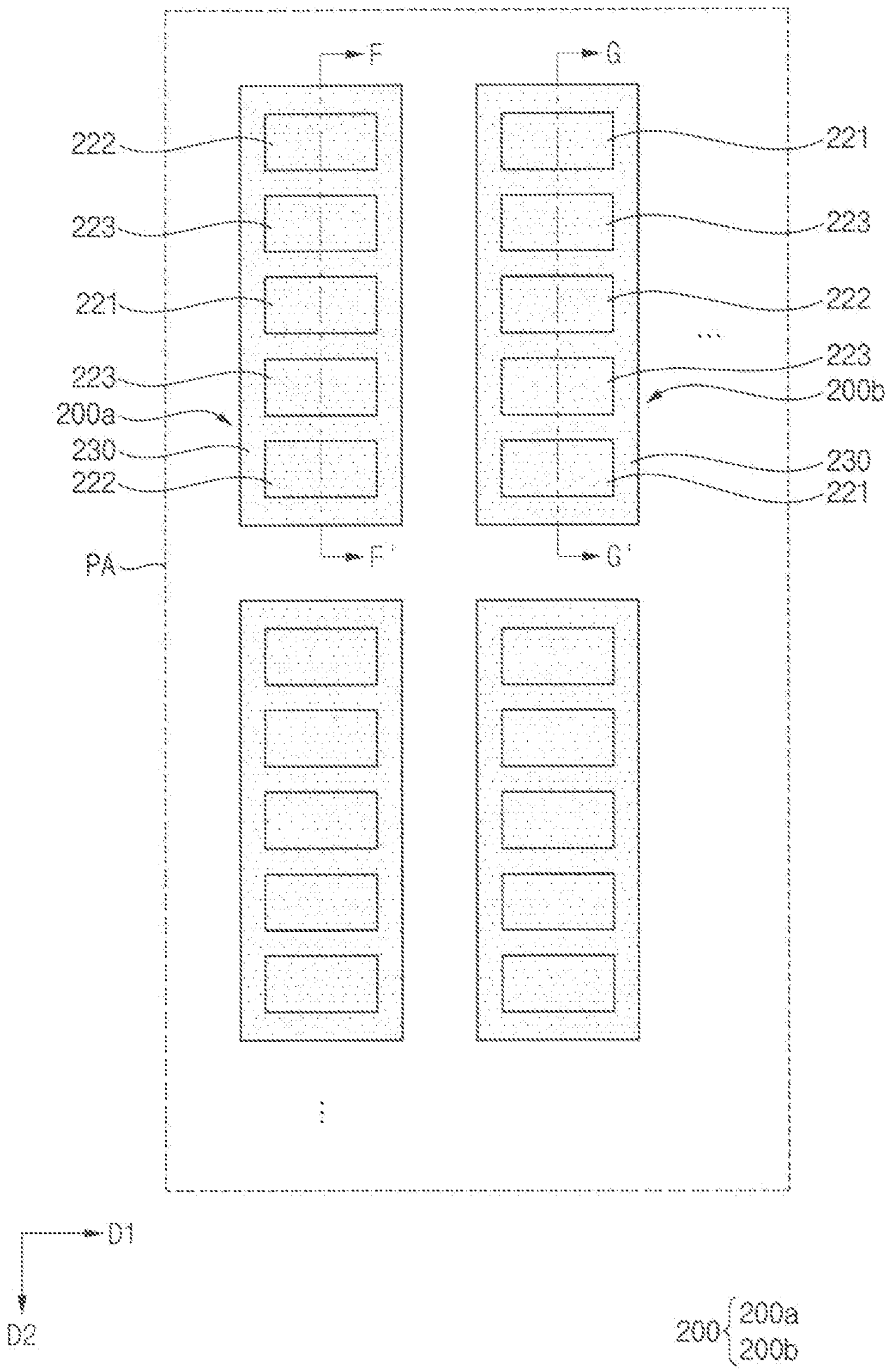
FIG. 12 is an enlarged schematic plan view of still another example of a pad area included in the display device of FIG. 1.
Figure 13:
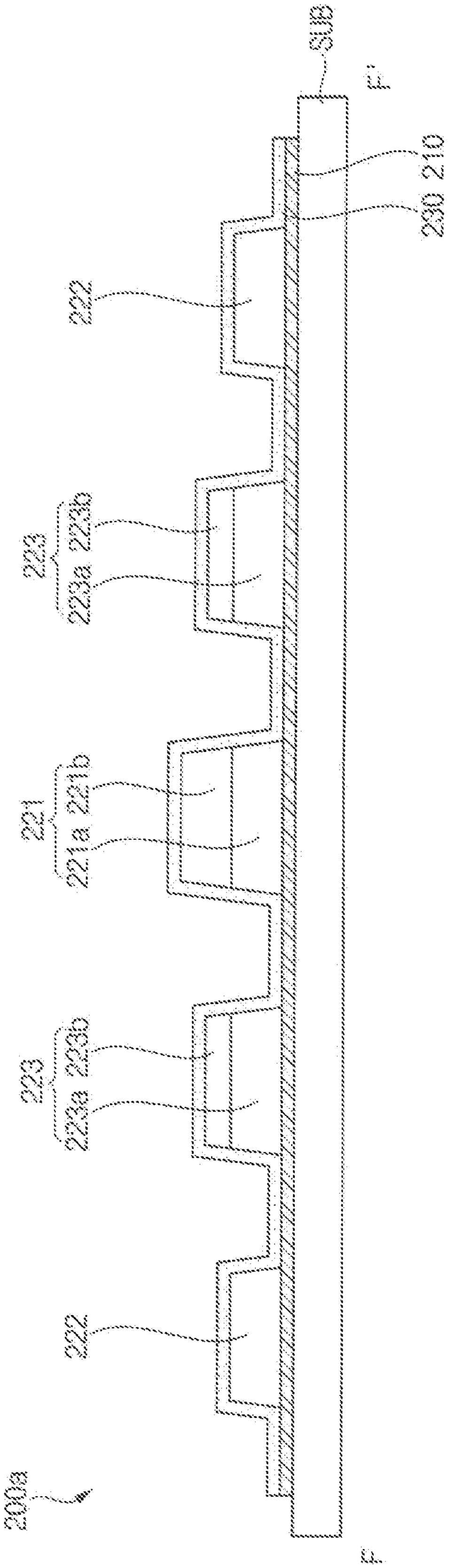
FIG. 13 is a schematic cross-sectional view illustrating an example taken along line F-F' of FIG. 12.
Figure 14:
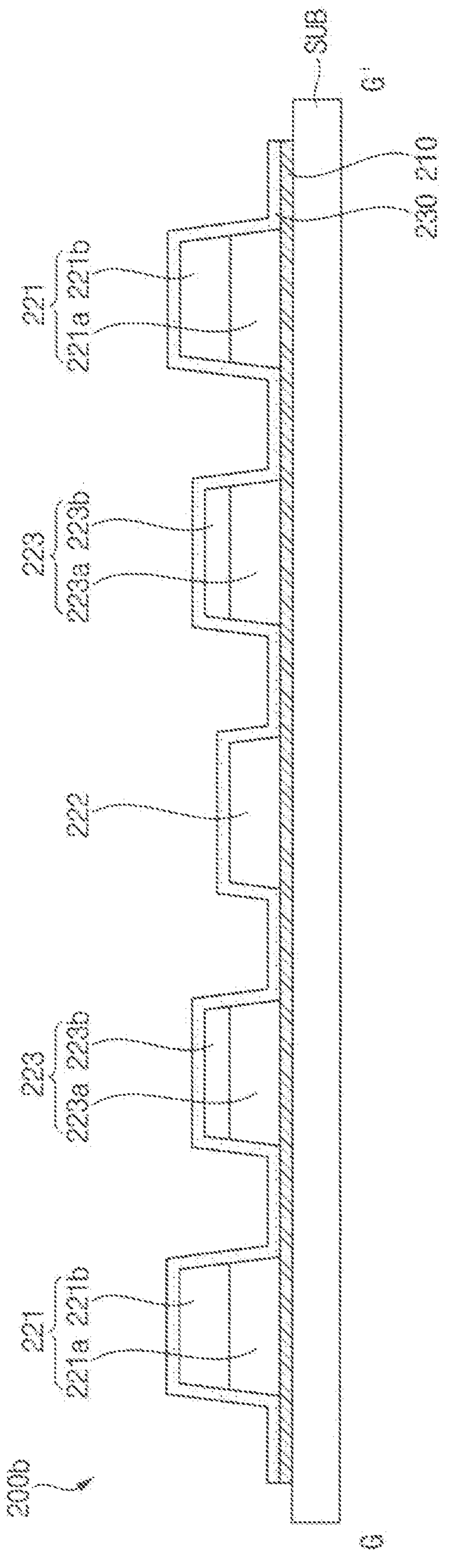
FIG. 14 is a schematic cross-sectional view illustrating an example taken along line G-G' of FIG. 12.

FIG. 12 is an enlarged schematic plan view of still another example of a pad area included in the display device of FIG. 1. FIG. 13 is a schematic cross-sectional view illustrating an example taken along line F-F' of FIG. 12. FIG. 14 is a schematic cross-sectional view illustrating an example taken along line G-G' of FIG. 12.

Referring to FIGS. 12 to 14, according to an embodiment, pads 200 may be disposed in the pad area PA. Each of the pads 200 may include a first conductive layer 210, a first protrusion 221, a second protrusion 222, a third protrusion 223, and a second conductive layer 230. For example, the first to third protrusions 221, 222, and 223 may be arranged in a line.

The first conductive layer 210 may be disposed in the pad area PA on the substrate SUB. The first conductive layer 210 may be substantially the same as or similar to the first conductive layer 110 described with reference to FIG. 3.

The first to third protrusions 221, 222, and 223 may be disposed on the first conductive layer 210. The first to third protrusions 221, 222, and 223 may have different thicknesses. For example, a thickness of the first protrusion 221 may be greater than a thickness of the second protrusion 222. A thickness of the third protrusion 223 may be smaller than the thickness of the first protrusion 221 and greater than the thickness of the second protrusion 222.

The first protrusion 221 may include a first protruding portion 221*a* and a second protruding portion 221*b* disposed on the first protruding portion 221*a*. The second protruding portion 221*b* may be formed after the first protruding portion 221*a* is formed. In an embodiment, each of the first protruding portion 221*a* and the second protruding portion 221*b* may include an organic material.

The second protrusion 222 may include an organic material. In an embodiment, the second protrusion 222 may include the same material as the first protruding portion 221*a* and may be formed substantially simultaneously with the first protruding portion 221*a*. For example, the thickness of the first protruding portion 221*a* and the thickness of the second protrusion 222 may be substantially the same.

The third protrusion 223 may include a first protruding portion 223*a* and a second protruding portion 223*b* disposed on the first protruding portion 223*a*. The second protruding portion 223*b* may be formed after the first protruding portion 223*a* is formed. In an embodiment, each of the first protruding portion 223*a* and the second protruding portion 223*b* may include an organic material.

In an embodiment, the first protruding portion 223*a* may include the same material as the first protruding portion 221*a* and may be formed substantially simultaneously with the first protruding portion 221*a*. For example, a thickness of the first protruding portion 223*a* may be substantially equal to a thickness of the first protruding portion 221*a*.

A thickness of the second protruding portion 223*b* may be smaller than a thickness of the second protruding portion 221*b*. Accordingly, the thickness of the third protrusion 223 may be smaller than the thickness of the first protrusion 221 and greater than the thickness of the second protrusion 222.

In an embodiment, the second protruding portion 223*b* may include the same material as the second protruding portion 221*b* and may be formed substantially simultaneously with the second protruding portion 221*b*. For example, the second protruding portions 221*b* and 223*b* may be formed substantially simultaneously to have different thicknesses using a halftone mask. In another embodiment, the second protruding portion 223*b* may be formed by a process different from a process of the second protruding portion 221*b*.

The second conductive layer 230 may be disposed on the first conductive layer 210. The second conductive layer 230 may cover an upper surface of each of the first to third protrusions 221, 222, and 223. In an embodiment, the second conductive layer 230 may entirely cover a side surface of each of the first to third protrusions 221, 222, and 223. In another embodiment, the second conductive layer 230 may expose at least a portion of a side surface of each of the first to third protrusions 221, 222, and 223.

The second conductive layer 230 may include a conductive material. The second conductive layer 230 may be formed after the first to third protrusions 221, 222, and 223 are formed. For example, the second conductive layer 230 may include the same material as the first touch electrode layer TCL1 or the second touch electrode layer TCL2 and may be formed substantially simultaneously with the first touch electrode layer TCL1 or the second touch electrode layer TCL2. For example, the second conductive layer 230 may have a three-layer structure of Ti/Al/Ti, but the disclosure is not limited thereto.

The second conductive layer 230 may directly contact a portion of the first conductive layer 210. Accordingly, the second conductive layer 230 may be electrically connected to the first conductive layer 210.

In an embodiment, in the adjacent pads 200*a* and 200*b*, the first to third protrusions 221, 222, and 223 may be differently disposed in a plan view. For example, as shown in FIG. 12, in the pad 200*a*, the first protrusion 221 may be disposed in the middle, and the second protrusions 222 may be disposed at both ends. In the pad 200*b* adjacent to the pad 200*a*, the second protrusion 222 may be disposed in the middle, and the first protrusions 221 may be disposed at both ends. However, the disclosure is not limited thereto.

Figure 15:
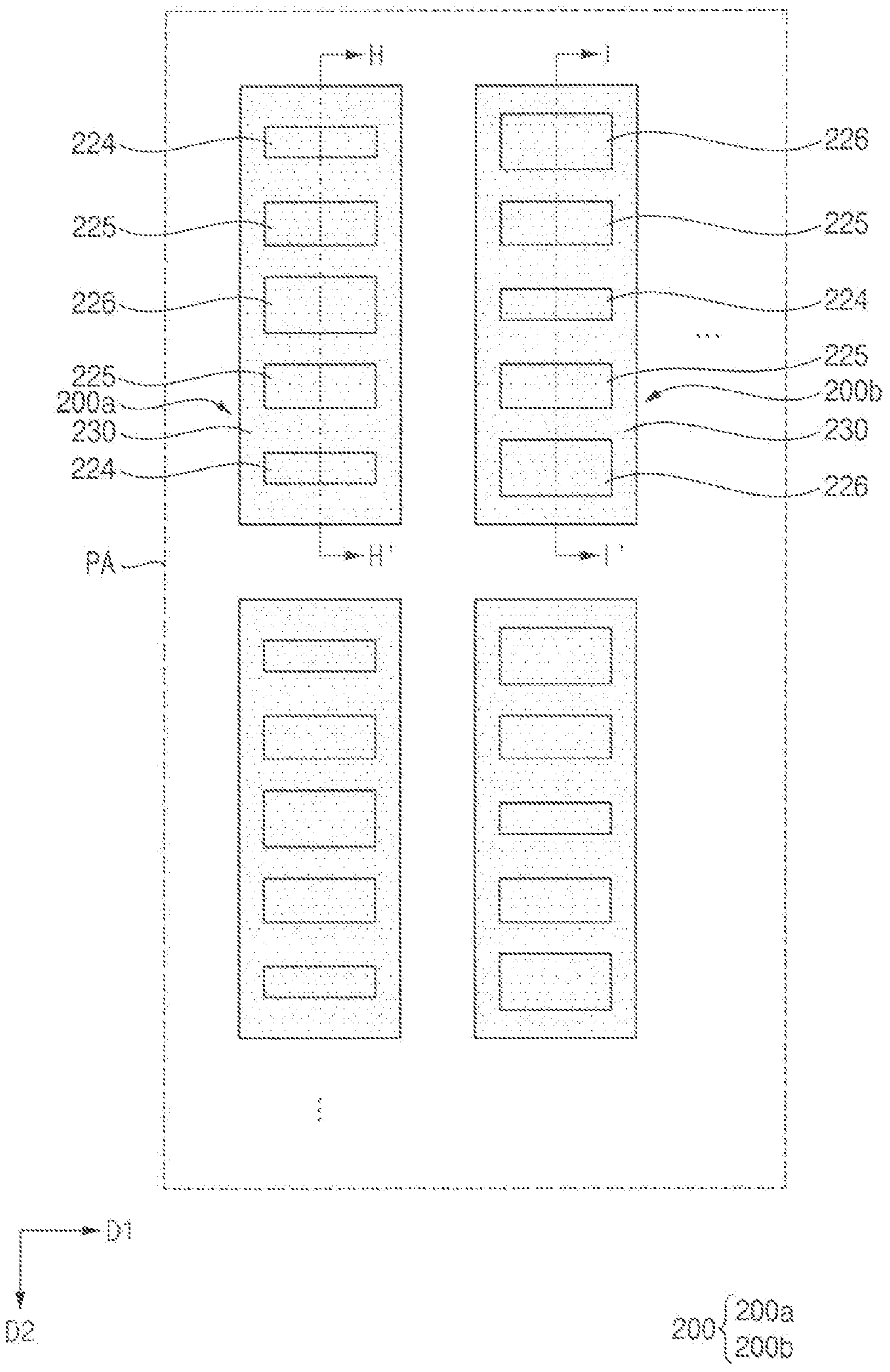
FIG. 15 is an enlarged schematic plan view of still another example of a pad area included in the display device of FIG. 1.
Figure 16:
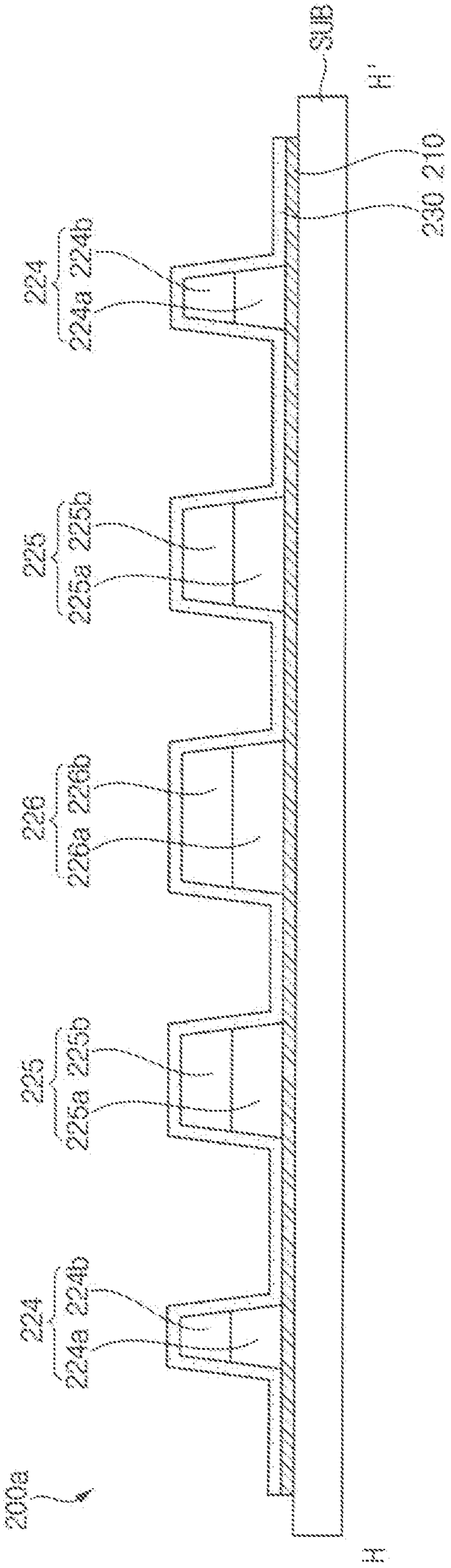
FIG. 16 is a schematic cross-sectional view illustrating an example taken along line H-H' of FIG. 15.
Figure 17:
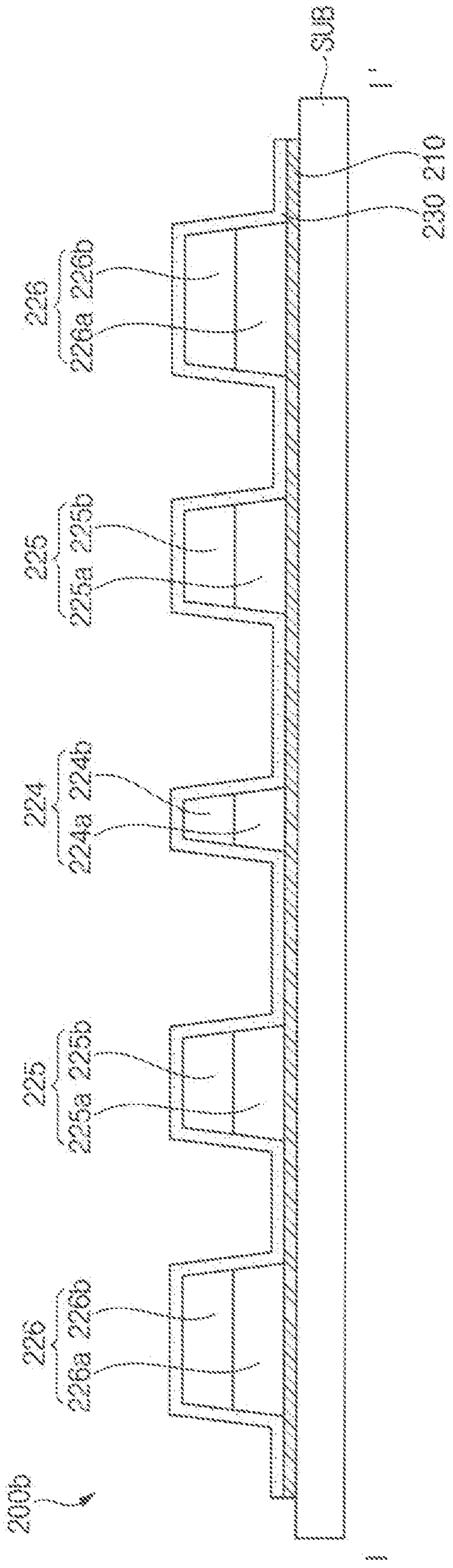
FIG. 17 is a schematic cross-sectional view illustrating an example taken along line I-I' of FIG. 15.

FIG. 15 is an enlarged schematic plan view of still another example of a pad area included in the display device of FIG. 1. FIG. 16 is a schematic cross-sectional view illustrating an example taken along line H-H' of FIG. 15. FIG. 17 is a schematic cross-sectional view illustrating an example taken along line I-I' of FIG. 15.

Referring to FIGS. 15 to 17, in an embodiment, each of the pads 200 may include a first conductive layer 210, a first protrusion 224, a second protrusion 225, a third protrusion 226, and a second conductive layer 230. For example, the first to third protrusions 224, 225, and 226 may be arranged in a line.

The first conductive layer 210 may be disposed in the pad area PA on the substrate SUB.

The first to third protrusions 224, 225, and 226 may be disposed on the first conductive layer 210.

Upper surfaces of the first to third protrusions 224, 225, and 226 may have different areas. For example, an area of the upper surface of the second protrusion 225 may be greater than an area of the upper surface of the first protrusion 224, and an area of the upper surface of the third protrusion 226 may be greater than the area of the upper surface of the second protrusion 225.

In an embodiment, the first to third protrusions 224, 225, and 226 may have substantially the same thickness. In another embodiment, the first to third protrusions 224, 225, and 226 may have different thicknesses.

The first protrusion 224 may include a first protruding portion **224*a* and a second protruding portion 224*b* disposed on the first protruding portion 224*a*. The second protrusion 225 may include a first protruding portion 225*a* and a second protruding portion 225*b* disposed on the first protruding portion 225*a*. The third protrusion 226 may include a first protruding portion 226*a* and a second protruding portion 226*b* disposed on the first protruding portion 226*a*. In an embodiment, the first protruding portions 224*a*, 225*a*, and 226*a* include the same organic material and may be formed substantially simultaneously. The second protruding portions 224*b*, 225*b*, and 226*b*** may include the same organic material and may be formed substantially simultaneously.

The second conductive layer 230 may be disposed on the first conductive layer 210. The second conductive layer 230 may cover the upper surface of each of the first to third protrusions 224, 225, and 226. In an embodiment, the second conductive layer 230 may entirely cover a side surface of each of the first to third protrusions 224, 225, and 226. In another embodiment, the second conductive layer 230 may expose at least a portion of a side surface of each of the first to third protrusions 224, 225, and 226.

The second conductive layer 230 may include a conductive material. The second conductive layer 230 may be formed after the first to third protrusions 224, 225, and 226 are formed. For example, the second conductive layer 230 may include the same material as the first touch electrode layer TCL1 or the second touch electrode layer TCL2 and may be formed substantially simultaneously with the first touch electrode layer TCL1 or the second touch electrode layer TCL2. For example, the second conductive layer 230 may have a three-layer structure of Ti/Al/Ti, but the disclosure is not limited thereto.

The second conductive layer 230 may directly contact a portion of the first conductive layer 210. Accordingly, the second conductive layer 230 may be electrically connected to the first conductive layer 210.

In an embodiment, in the adjacent pads **200*a* and 200*b*, the first to third protrusions 224, 225, and 226 may be differently disposed in a plan view. For example, as shown in FIG. 15, in the pad 200*a*, the third protrusion 226 may be disposed in the middle, and the first protrusions 224 may be disposed at both ends. In the pad 200*b* adjacent to the pad 200*a*, the first protrusion 224 may be disposed in the middle, and the third protrusions 226** may be disposed at both ends. However, the disclosure is not limited thereto.

Figure 18:
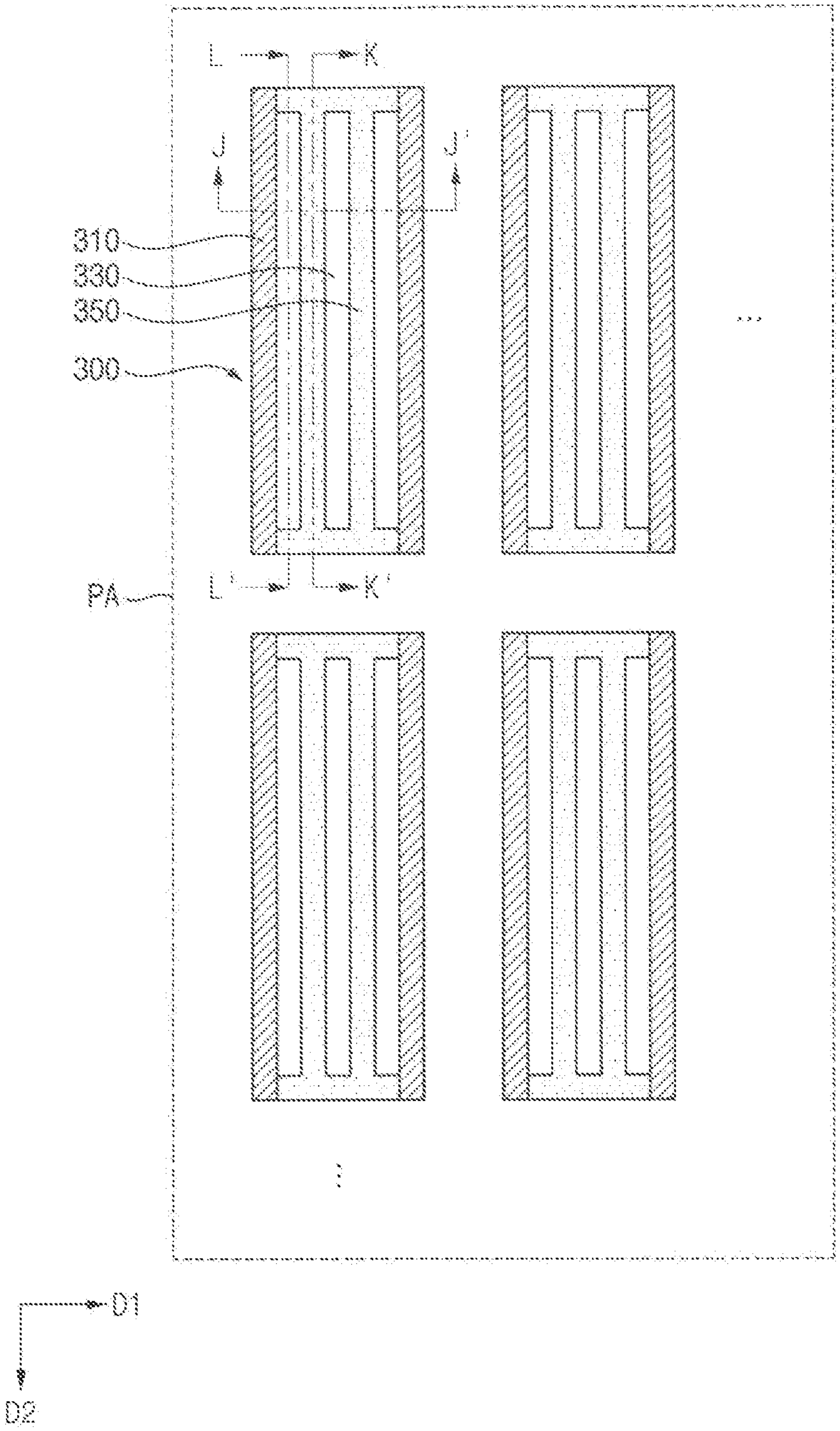
FIG. 18 is an enlarged schematic plan view of still another example of a pad area included in the display device of FIG. 1.
Figure 19:
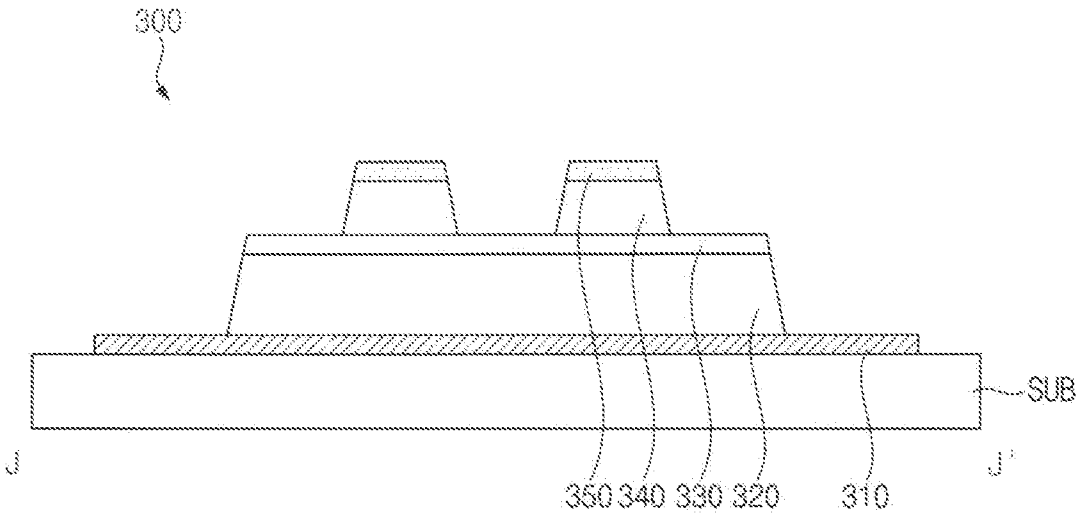
FIG. 19 is a schematic cross-sectional view illustrating an example taken along line J-J' of FIG. 18.
Figure 20:
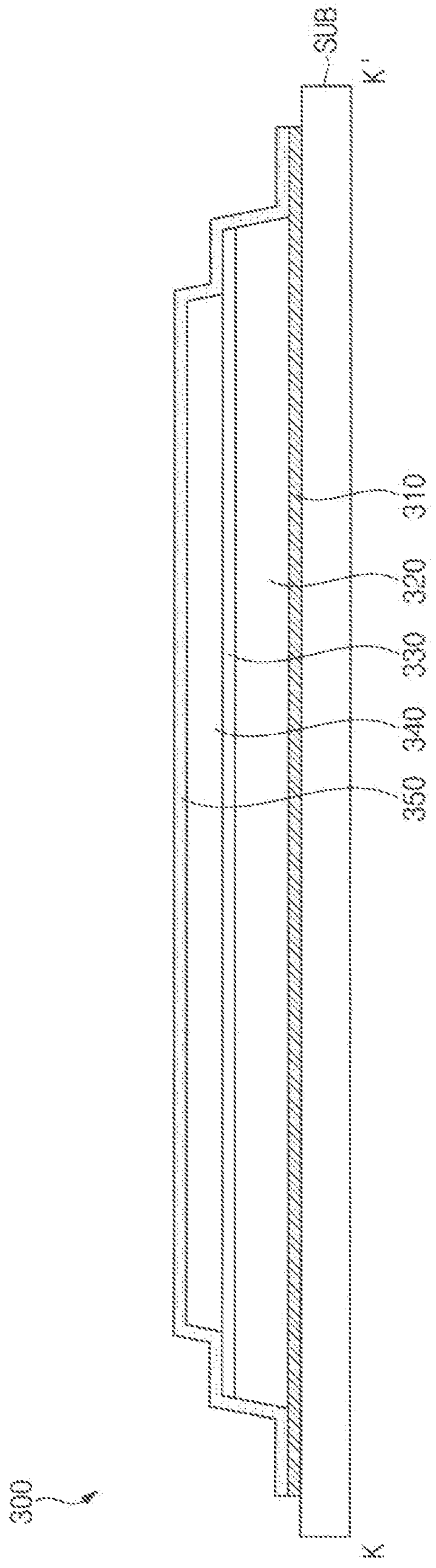
FIG. 20 is a schematic cross-sectional view illustrating an example taken along line K-K' of FIG. 18.
Figure 21:
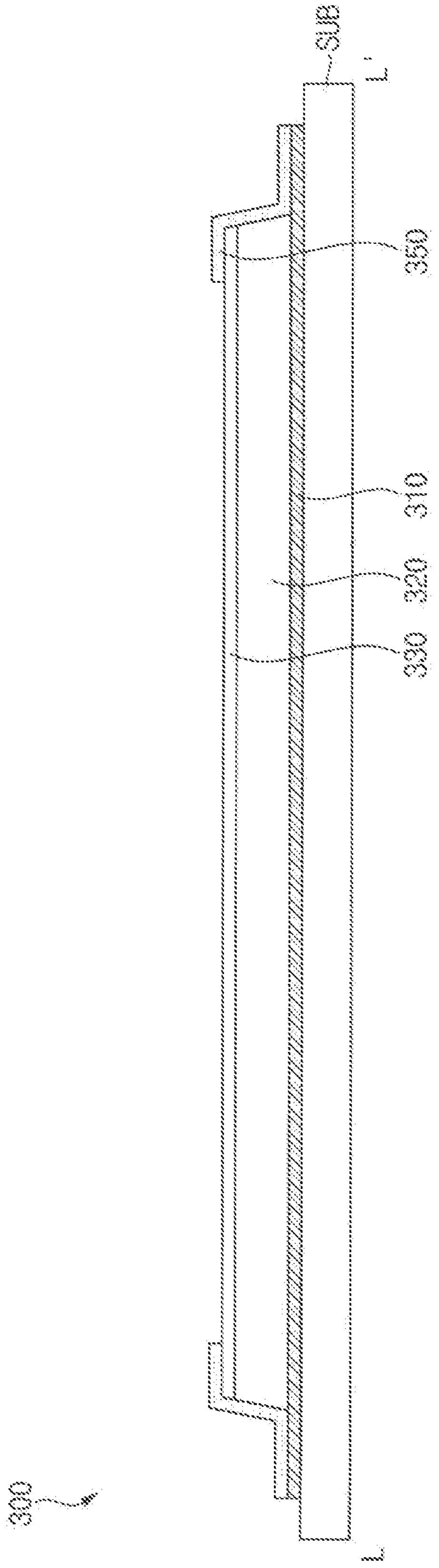
FIG. 21 is a schematic cross-sectional view illustrating an example taken along line L-L' of FIG. 18.

FIG. 18 is an enlarged schematic plan view of still another example of a pad area included in the display device of FIG. 1. FIG. 19 is a schematic cross-sectional view illustrating an example taken along line J-J' of FIG. 18. FIG. 20 is a schematic cross-sectional view illustrating an example taken along line K-K' of FIG. 18. FIG. 21 is a schematic cross-sectional view illustrating an example taken along line L-L' of FIG. 18.

Referring to FIGS. 18 to 21, according to an embodiment, pads 300 may be disposed in the pad area PA. Each of the pads 300 may include a first conductive layer 310, a first organic layer 320, a second organic layer 340, and a second conductive layer 350.

The first conductive layer 310 may be disposed in the pad area PA on the substrate SUB. The first conductive layer 310 may be substantially the same as or similar to the first conductive layer 110 described with reference to FIG. 3. The first conductive layer 310 may extend in the second direction D2.

The first organic layer 320 may be disposed on the first conductive layer 310. The first organic layer 320 may extend in the second direction D2. In an embodiment, the first organic layer 320 may cover a central portion of the first conductive layer 310 and may expose a peripheral portion.

The second organic layer 340 may be disposed on the first organic layer 320. The second organic layer 340 may be partially disposed on the first organic layer 320. For example, the second organic layer 340 may cover a portion of the upper surface of the first organic layer 320 and may expose another portion.

In an embodiment, the second organic layer 340 may include stripe patterns extending in the second direction D2 and spaced apart from each other in the first direction D1.

In an embodiment, the inorganic layer 330 may be disposed between the first organic layer 320 and the second organic layer 340. The inorganic layer 330 may be entirely disposed on the first organic layer 320. The inorganic layer 330 may improve adhesion between the first organic layer 320 and the second organic layer 340.

Figure 23:
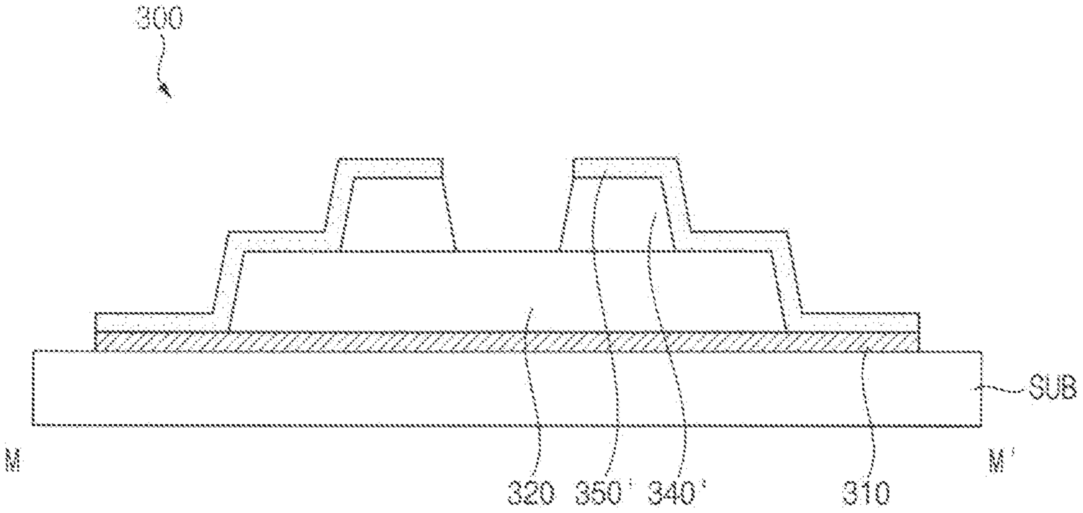
FIG. 23 is a schematic cross-sectional view illustrating an example taken along line M-M' of FIG. 22.

In another embodiment, the inorganic layer 330 may be omitted (see FIG. 23). In this case, the modulus of the organic layer including the first organic layer 320 and the second organic layer 340 may be improved.

The second conductive layer 350 may be disposed on the second organic layer 340. The second conductive layer 350 may cover an upper surface of the second organic layer 340. The second conductive layer 350 may expose at least a portion of a side surface of the second organic layer 340. In an embodiment, the second conductive layer 350 may cover the upper surface of each of the stripe patterns of the second organic layer 340 and may expose at least a portion of the side surface of each of the stripe patterns of the second organic layer 340. Accordingly, it may be possible to prevent or reduce cracks in the second conductive layer 350 that occur as the stripe patterns of the second organic layer 340 are compressed by the pressure applied in the ultrasonic bonding process.

The second conductive layer 350 may include a conductive material. The second conductive layer 350 may be formed after the first and second organic layers 320 and 340 may be formed. For example, the second conductive layer 350 may include the same material as the first touch electrode layer TCL1 or the second touch electrode layer TCL2 and may be formed substantially simultaneously with the first touch electrode layer TCL1 or the second touch electrode layer TCL2. For example, the second conductive layer 350 may have a three-layer structure of Ti/Al/Ti, but the disclosure is not limited thereto.

The second conductive layer 350 may directly contact a portion of the first conductive layer 310. For example, the second conductive layer 350 may directly contact the peripheral portion of the first conductive layer 310 exposed by the first organic layer 320. Accordingly, the second conductive layer 350 may be electrically connected to the first conductive layer 310.

Figure 22:
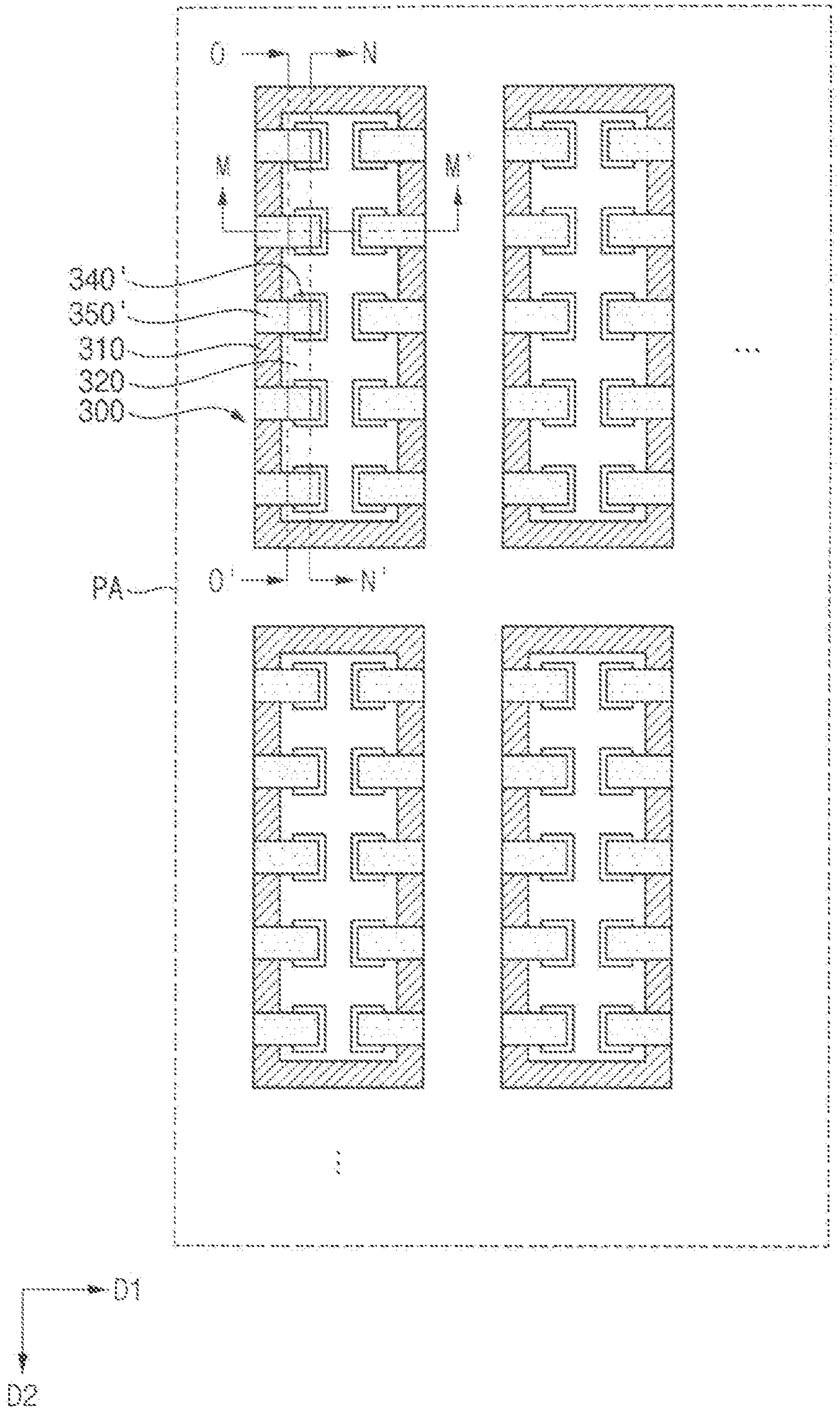
FIG. 22 is an enlarged schematic plan view of still another example of a pad area included in the display device of FIG. 1.
Figure 24:
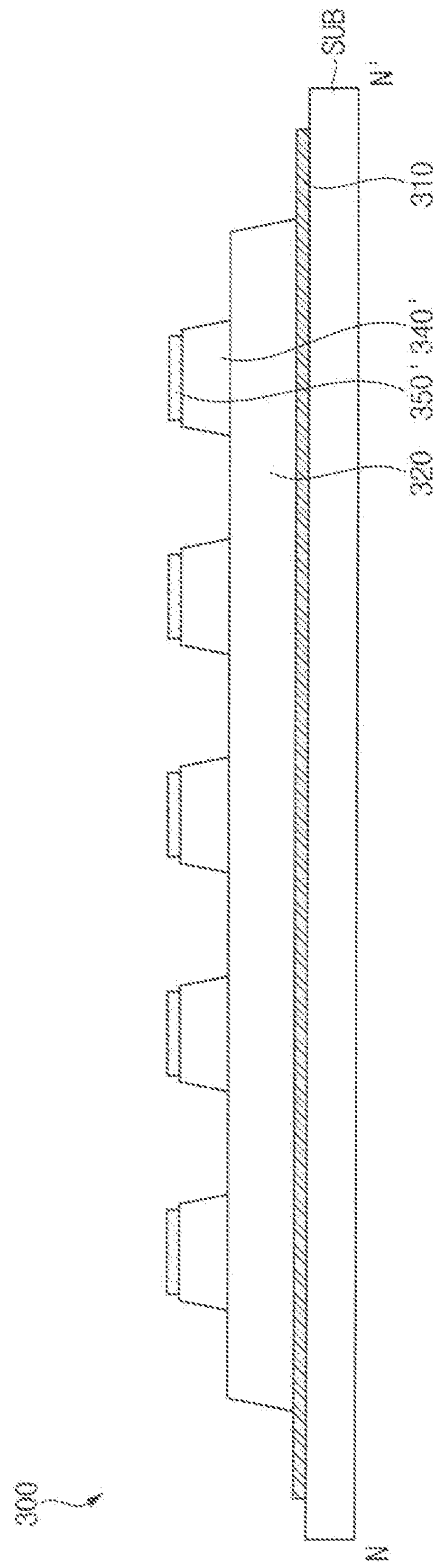
FIG. 24 is a schematic cross-sectional view illustrating an example taken along line N-N' of FIG. 22.
Figure 25:
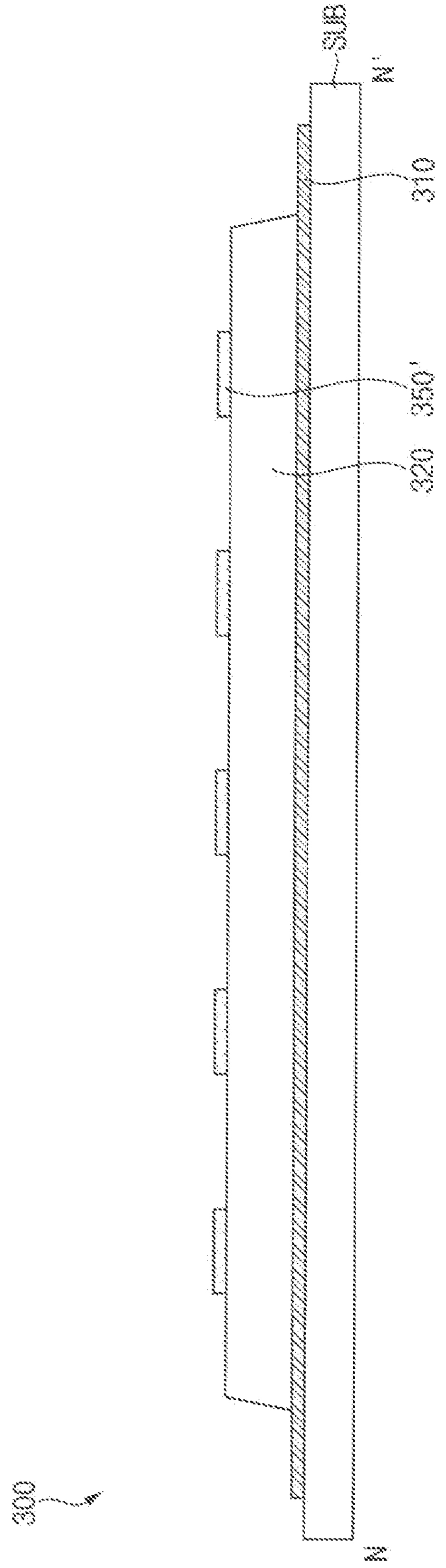
FIG. 25 is a schematic cross-sectional view illustrating an example taken along line O-O' of FIG. 22.

FIG. 22 is an enlarged schematic plan view of still another example of a pad area included in the display device of FIG. 1. FIG. 23 is a schematic cross-sectional view illustrating an example taken along line M-M' of FIG. 22. FIG. 24 is a schematic cross-sectional view illustrating an example taken along line N-N' of FIG. 22. FIG. 25 is a schematic cross-sectional view illustrating an example taken along line O-O' of FIG. 22.

Referring to FIGS. 22 to 25, in an embodiment, the second organic layer 340' may include isolated (island) patterns arranged in a matrix form in a plan view. For example, the second organic layer 340' may include island patterns arranged in two columns. Although FIG. 22 shows that the island patterns are arranged in 5 rows, the disclosure is not limited thereto, and the island patterns may be arranged in 1 to 4 rows or 6 or more rows.

The second conductive layer 350' may cover an upper surface of the second organic layer 340'. The second conductive layer 350' may expose at least a portion of a side surface of the second organic layer 340'. In an embodiment, the second conductive layer 350' may include stripe patterns respectively corresponding to the island patterns and extending in the first direction D1. Each of the stripe patterns may be continuously disposed from an upper surface of the corresponding island pattern to the peripheral portion of the first conductive layer 310. Each of the stripe patterns may expose at least a portion of a side surface of the corresponding island pattern. Accordingly, it may be possible to prevent or reduce cracks in the second conductive layer 350' that occur as the island patterns of the second organic layer 340' are compressed by the pressure applied in the ultrasonic bonding process.

The second conductive layer 350' may include a conductive material. The second conductive layer 350' may be formed after the first and second organic layers 320 and 340' may be formed. For example, the second conductive layer 350' may include the same material as the first touch electrode layer TCL1 or the second touch electrode layer TCL2 and may be formed substantially simultaneously with the first touch electrode layer TCL1 or the second touch electrode layer TCL2. For example, the second conductive layer 350' may have a three-layer structure of Ti/Al/Ti, but the disclosure is not limited thereto.

The second conductive layer 350' may directly contact a portion of the first conductive layer 310. For example, each of the stripe patterns of the second conductive layer 350' may directly contact the peripheral portion of the first conductive layer 310. Accordingly, the stripe patterns of the second conductive layer 350' may be electrically connected to the first conductive layer 310.

Figure 26:
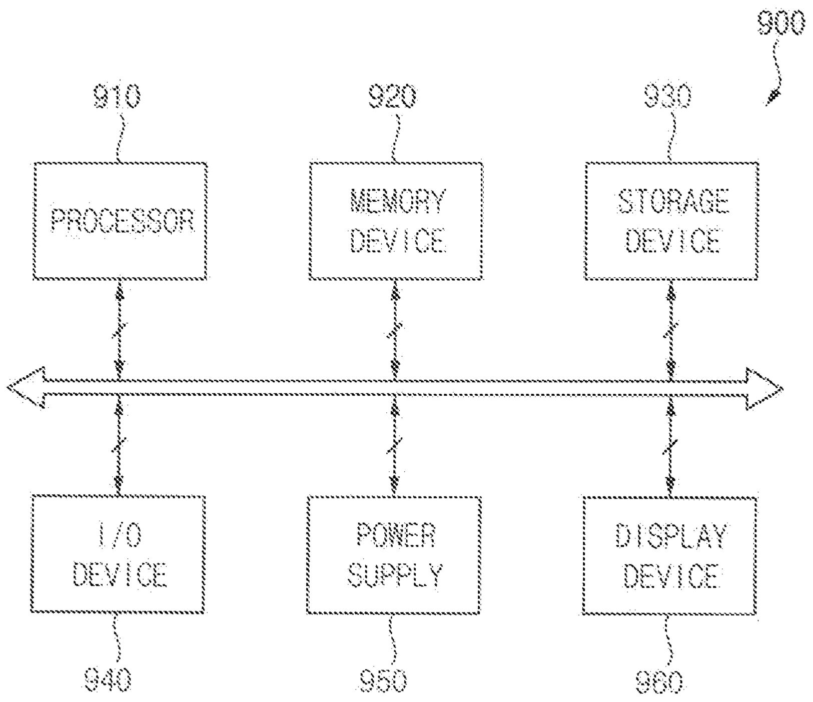
FIG. 26 is a schematic block diagram illustrating an electronic device according to an embodiment of the disclosure.

FIG. 26 is a schematic block diagram illustrating an electronic device according to an embodiment of the disclosure.

Referring to FIG. 26, an electronic device 900 according to an embodiment may include a processor 910, a memory device 920, a storage device 930, an input/output device 940, a power supply 950, and a display device 960. In this case, the display device 960 may correspond to the display device DD of FIG. 1. The electronic device 900 may further include various ports capable of communicating with a video card, a sound card, a memory card, a USB device, and the like. In an embodiment, the electronic device 900 may be implemented as a television. In another embodiment, the electronic device 900 may be implemented as a smartphone. However, the electronic device 900 is not limited thereto, and for example, the electronic device 900 may be implemented as a mobile phone, a video phone, a smart pad, a smart watch, a tablet PC, a vehicle navigation system, a computer monitor, a notebook computer, a head mounted display (HMD), or the like.

The processor 910 may perform certain calculations or tasks. In an embodiment, the processor 910 may be a microprocessor, a central processing unit (CPU), an application processor (AP), or the like. The processor 910 may be connected to other components through an address bus, a control bus, a data bus, and the like. In an embodiment, the processor 910 may also be coupled to an expansion bus, such as a peripheral component interconnect (PCI) bus.

The memory device 920 may store data necessary for the operation of the electronic device 900. For example, the memory device 920 may include non-volatile memory devices such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and/or a volatile memory device such as a dynamic random access memory (DRAM) devices, a static random access memory (SRAM) devices, mobile DRAM devices, etc.

The storage device 930 may include a solid state drive (SSD), a hard disk drive (HDD), a CD-ROM, and the like. The input/output device 940 may include an input such as a keyboard, a keypad, a touch pad, a touch screen, and a mouse, and an output such as a speaker and a printer.

The power supply 950 may supply power required for the operation of the electronic device 900. The display device 960 may be coupled to other components through buses or other communication links. According to an embodiment, the display device 960 may be included in the input/output device 940.

Although certain embodiments have been described herein, other embodiments and modifications will be apparent from this description. Accordingly, the disclosure is not limited to such embodiments, but rather to the broader scope of the disclosure, and various modifications and equivalent arrangements as would be apparent to a person of ordinary skill in the art.

What is claimed is:

1. A display panel comprising:
a display area;
a pad area adjacent to the display area;
pixels disposed in the display area on a substrate; and
pads disposed in the pad area on the substrate and electrically connected to the pixels,
wherein each of the pads includes:
a first conductive layer;
at least one first protrusion disposed on the first conductive layer;
at least one second protrusion disposed on the first conductive layer and having a thickness smaller than a thickness of the at least one first protrusion; and a second conductive layer disposed on the first conductive layer and overlapping an upper surface of the at least one first protrusion and an upper surface of the at least one second protrusion in a plan view.

2. The display panel of claim 1, further comprising:

a step formed between an upper surface of a portion of the second conductive layer overlapping the upper surface of the at least one first protrusion in a plan view and an upper surface of another portion of the second conductive layer overlapping the upper surface of the at least one second protrusion in a plan view.

3. The display panel of claim 2, wherein the second conductive layer has a uniform thickness.

4. The display panel of claim 1, wherein the at least one first protrusion includes first protrusions, the at least one second protrusion includes second protrusions, and the first protrusions and the second protrusions are arranged in a matrix form in a plan view.

5. The display panel of claim 4, wherein the first protrusions and the second protrusions are alternately arranged in a row direction and a column direction.

6. The display panel of claim 1, wherein the at least one first protrusion includes first protrusions, the at least one second protrusion includes second protrusions, and the first protrusions and the second protrusions are irregularly arranged in a plan view.

7. The display panel of claim 1, wherein the second conductive layer entirely covers a side surface of the at least one first protrusion in a plan view, and the second conductive layer entirely covers a side surface of the at least one second protrusion in a plan view.

8. The display panel of claim 1, wherein the second conductive layer exposes at least a portion of a side surface of each of the at least one first protrusion and the at least one second protrusion.

9. The display panel of claim 1, wherein each of the pads further includes a third protrusion having a thickness smaller than the thickness of the at least one first protrusion and greater than the thickness of the at least one second protrusion, and the second conductive layer further overlaps an upper surface of the third protrusion in a plan view.

10. The display panel of claim 1, further comprising:

an encapsulation layer overlapping the pixels in a plan view; and a touch sensing layer disposed on the encapsulation layer and including at least one touch insulating layer and at least one touch electrode layer, wherein the second conductive layer and the at least one touch electrode layer include a same material.

11. The display panel of claim 1, wherein the at least one first protrusion includes a first protruding portion and a second protruding portion disposed on the first protruding portion.

12. The display panel of claim 11, wherein each of the first protruding portion and the second protruding portion includes an organic material, and the at least one second protrusion and the first protruding portion include a same material.

13. The display panel of claim 12, wherein the first protruding portion and the at least one second protrusion are separated from each other.

14. The display panel of claim 12, wherein the first protruding portion and the at least one second protrusion are integral with each other.

15. The display panel of claim 14, wherein the second conductive layer entirely covers an upper surface and a side surface of the second protruding portion.

16. The display panel of claim 14, wherein the second conductive layer entirely covers an upper surface of the second protruding portion, and the second conductive layer exposes at least a portion of a side surface of the second protruding portion.

17. The display panel of claim 11, wherein the first protruding portion includes an inorganic material, the second protruding portion includes an organic material, and the at least one second protrusion and the second protruding portion include a same material.

18. A display panel comprising:

a display area;

a pad area adjacent to the display area;

pixels disposed in the display area on a substrate; and pads disposed in the pad area on the substrate and electrically connected to the pixels, wherein each of the pads includes:

a first conductive layer;

a first organic layer disposed on the first conductive layer;

a second organic layer partially disposed on the first organic layer; and a second conductive layer disposed on the first conductive layer, overlapping an upper surface of the second organic layer in a plan view, and exposing at least a portion of a side surface of the second organic layer.

19. The display panel of claim 18, wherein the second organic layer includes stripe patterns, and the second conductive layer overlaps an upper surface of each of the stripe patterns in a plan view and exposes at least a portion of a side surface of each of the stripe patterns.

20. The display panel of claim 18, wherein the second organic layer includes isolated patterns arranged in a matrix form in a plan view, the second conductive layer includes stripe patterns respectively corresponding to the isolated patterns, and each of the stripe patterns exposes a portion of a side surface of one of the isolated patterns corresponding to the stripe patterns.

21. The display panel of claim 18, wherein each of the pads further includes an inorganic layer disposed between the first organic layer and the second organic layer.

22. A display device comprising:

a display panel including:

a display area;

a pad area adjacent to the display area;

pixels disposed in the display area on a substrate; and pads disposed in the pad area on the substrate and electrically connected to the pixels; and a driving chip bonded to the pad area on the substrate and including bumps connected to the pads, wherein each of the pads comprises:

a first conductive layer;

a first protrusion disposed on the first conductive layer;

a second protrusion disposed on the first conductive layer and having a thickness smaller than a thickness of the first protrusion; and a second conductive layer disposed on the first conductive layer and overlapping an upper surface of the first protrusion and an upper surface of the second protrusion.

23. The display device of claim 22, wherein each of the bumps directly contacts the second conductive layer of each of the pads corresponding to the bumps.

24. The display device of claim 23, wherein the driving chip is an ultrasonically-bonded driving chip.

* * * * *